(12) United States Patent
Hosotani

(10) Patent No.: US 7,247,505 B2
(45) Date of Patent: Jul. 24, 2007

(54) MAGNETIC MEMORY DEVICE HAVING MAGNETIC SHIELD LAYER, AND MANUFACTURING METHOD THEREOF

(75) Inventor: Keiji Hosotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 11/070,379

(22) Filed: Mar. 3, 2005

(65) Prior Publication Data

US 2005/0169044 A1 Aug. 4, 2005

Related U.S. Application Data

(62) Division of application No. 10/317,141, filed on Dec. 12, 2002, now Pat. No. 6,977,401.

(30) Foreign Application Priority Data

Dec. 18, 2001 (JP) ............... 2001-384793

(51) Int. Cl.
*H01L 21/00* (2006.01)
(52) U.S. Cl. .................... 438/3; 257/E43.004
(58) Field of Classification Search ............ 438/3; 257/43.004
See application file for complete search history.

(56) References Cited

U.S. PATENT DOCUMENTS

| | | | |
|---|---|---|---|
| 5,640,343 | A | 6/1997 | Gallagher et al. |
| 5,902,690 | A | 5/1999 | Tracy et al. |
| 6,211,090 | B1 | 4/2001 | Durlam et al. |
| 6,288,929 | B1 | 9/2001 | Lienau |
| 2005/0201147 | A1* | 9/2005 | Kajiyama ............... 365/173 |

FOREIGN PATENT DOCUMENTS

| | | |
|---|---|---|
| JP | 11-238377 | 8/1999 |
| JP | 2000-90658 | 3/2000 |
| JP | 2000-353791 | 12/2000 |
| JP | 2001-237472 | 8/2001 |
| JP | 2001-284550 | 10/2001 |
| JP | 2002-526909 | 8/2002 |
| JP | 2002-368199 | 12/2002 |
| KR | 2001-0100862 | 11/2001 |
| WO | WO 00/10172 | 2/2000 |
| WO | WO 00/72324 A1 | 11/2000 |
| WO | WO 01/71777 A2 | 9/2001 |

* cited by examiner

*Primary Examiner*—Bradley K Smith
(74) *Attorney, Agent, or Firm*—Oblon, Spivak, McClelland, Maier & Neustadt, P.C.

(57) ABSTRACT

A magnetic memory device includes a first wiring layer which runs in the first direction, a memory element which is arranged above the first wiring layer, second wiring layers which are arranged on the memory element and run in a second direction different from the first direction, and a first magnetic shield layer which is formed on the side surface of each second wiring layer and formed around the side surface of the memory element.

14 Claims, 37 Drawing Sheets

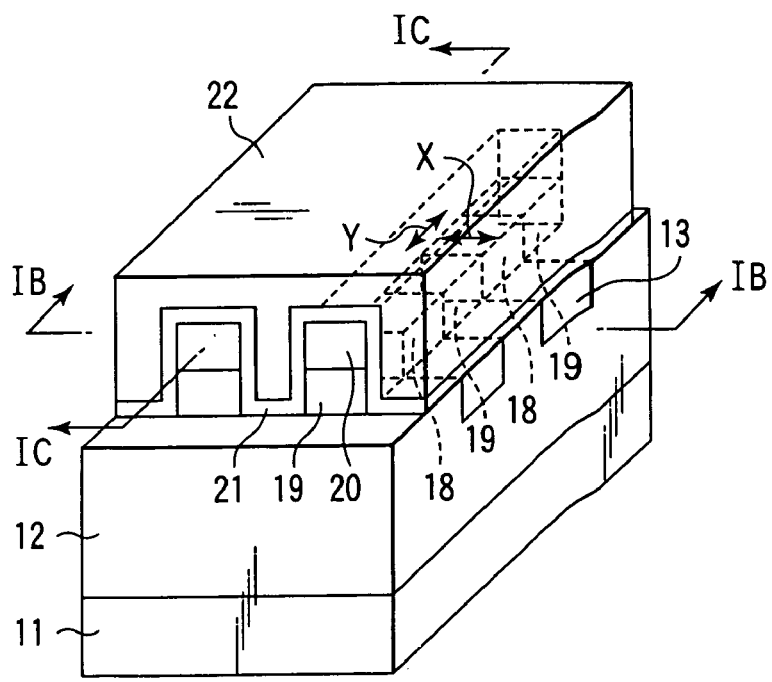
F I G. 1A
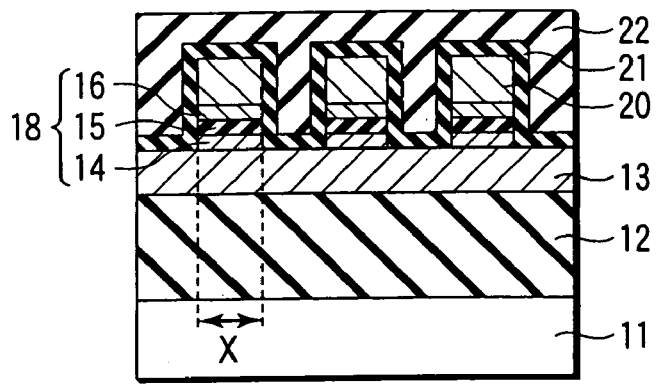
F I G. 1B
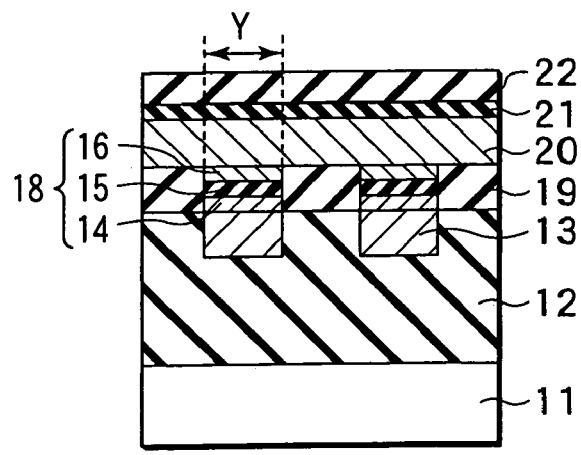
F I G. 1C

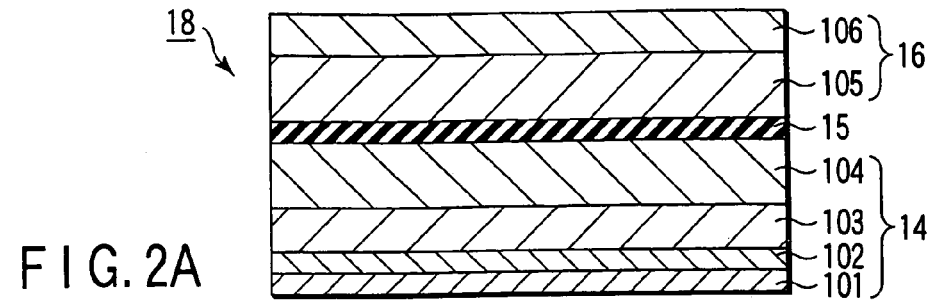
F I G. 2A
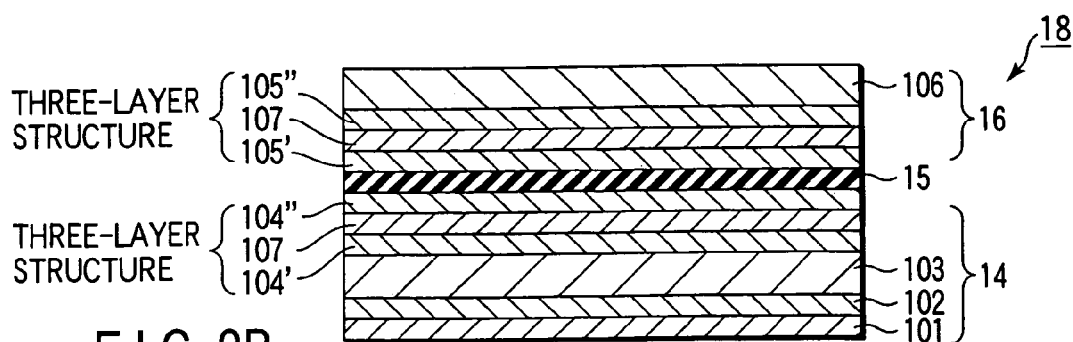
F I G. 2B
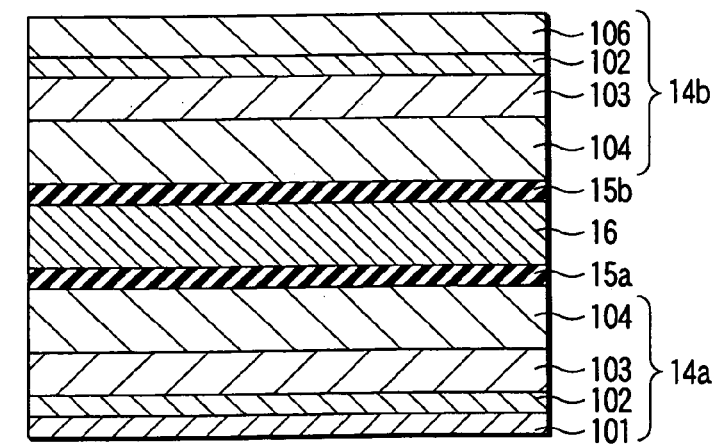
F I G. 3A
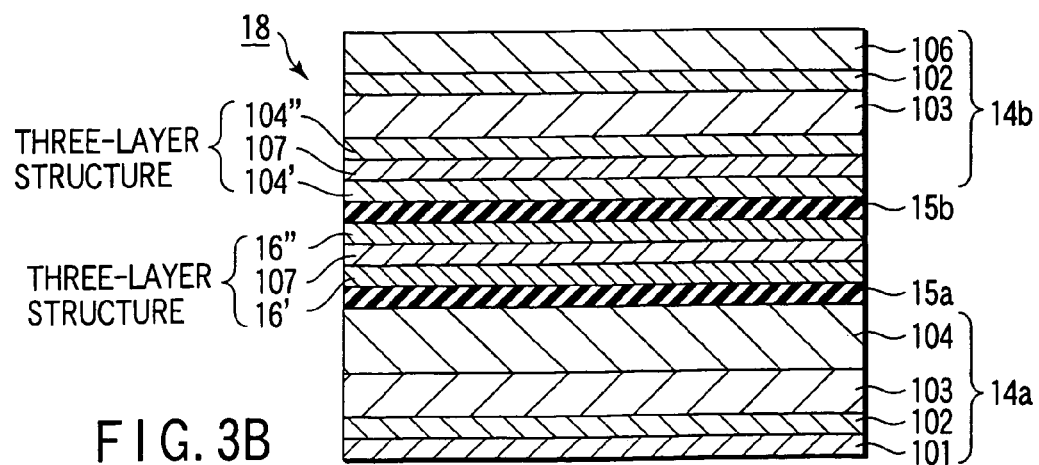
F I G. 3B

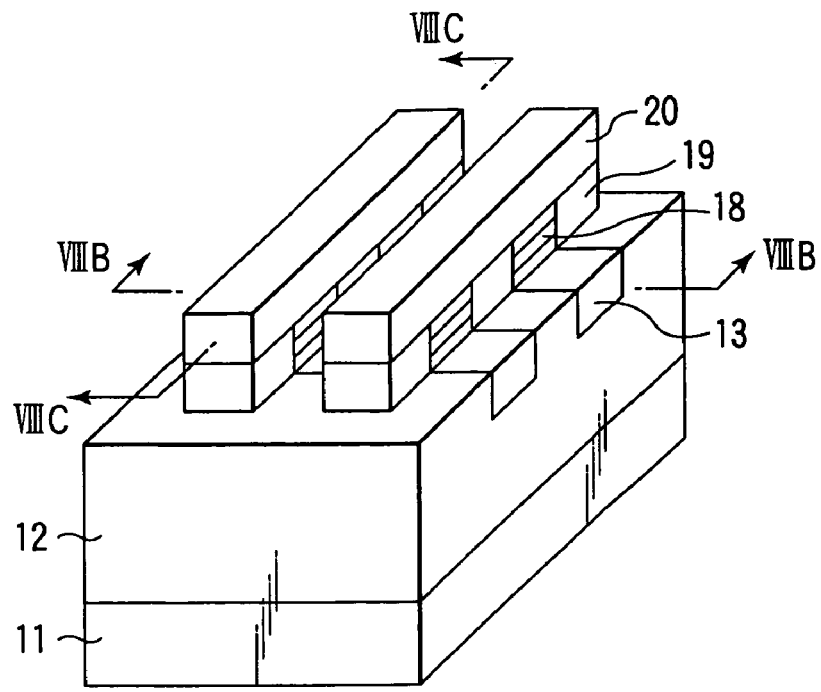
F I G. 8A
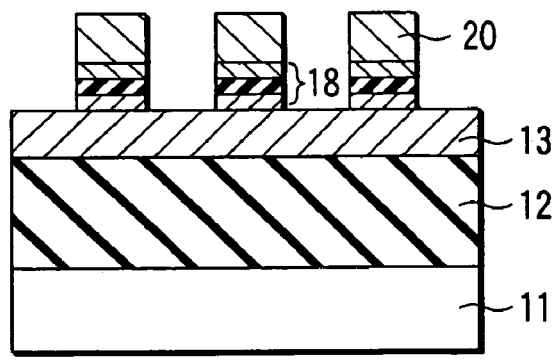
F I G. 8B
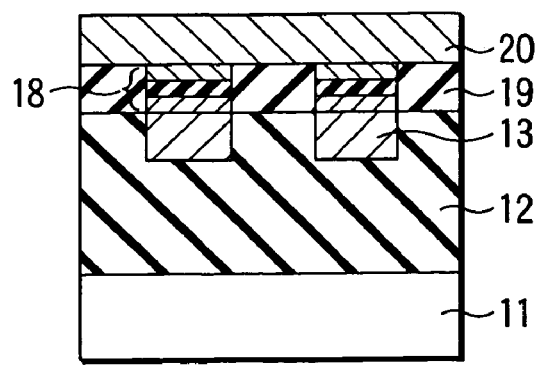
F I G. 8C

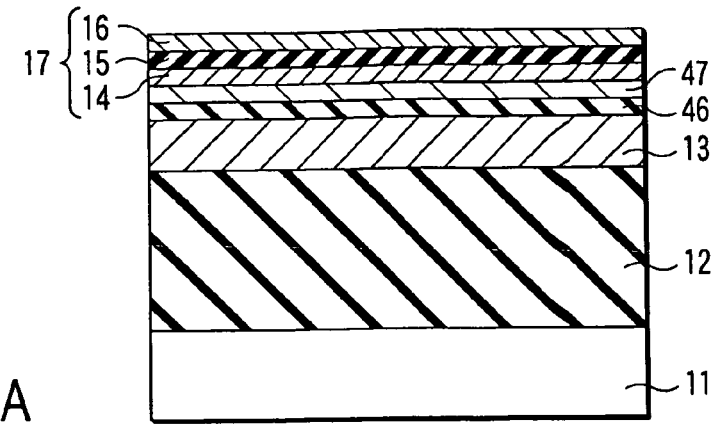
F I G. 18A
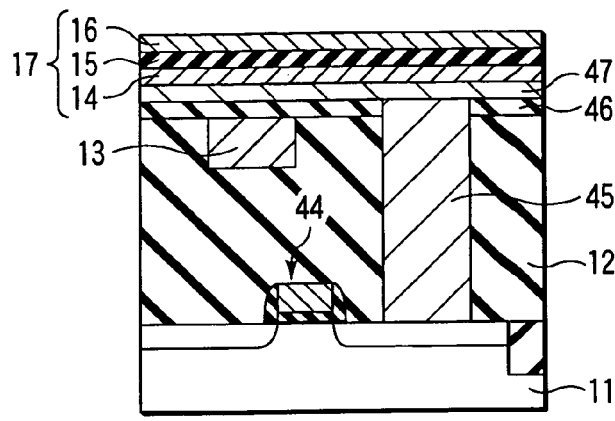
F I G. 18B
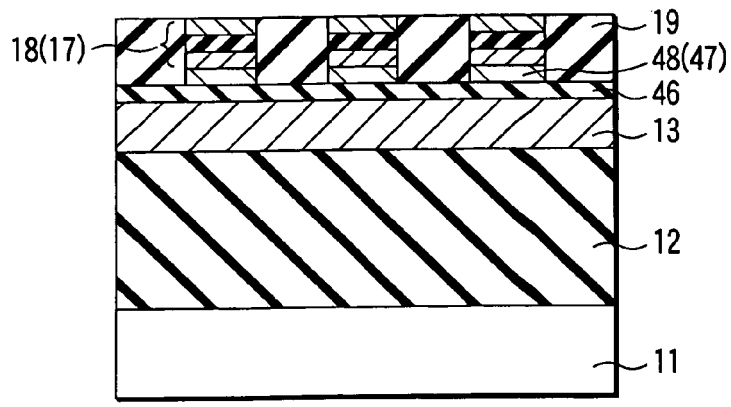
F I G. 19A
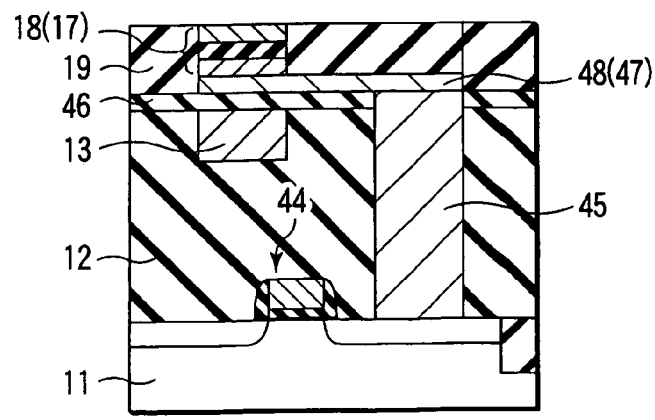
F I G. 19B

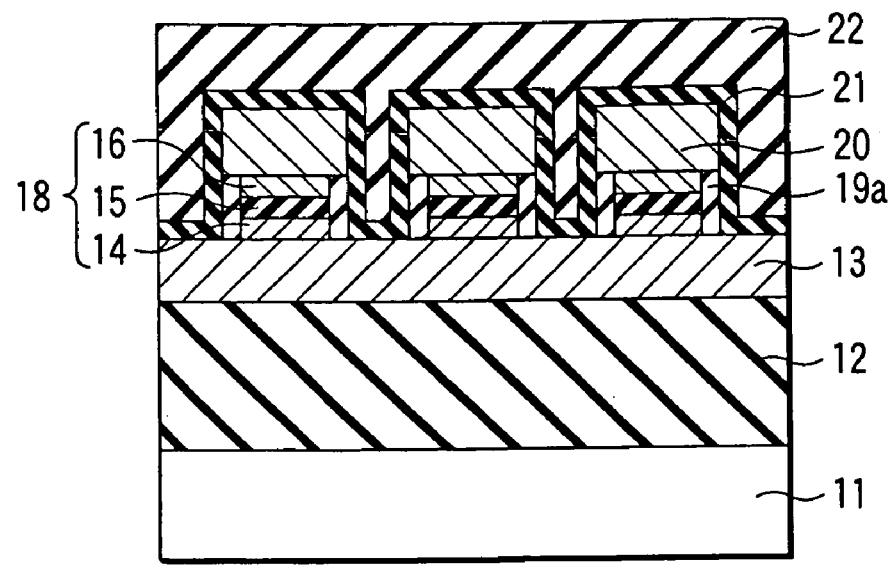
F I G. 39
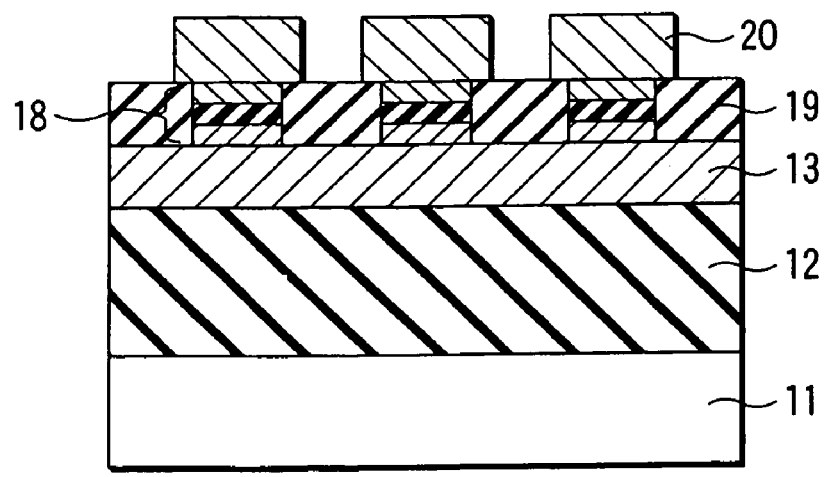
F I G. 40

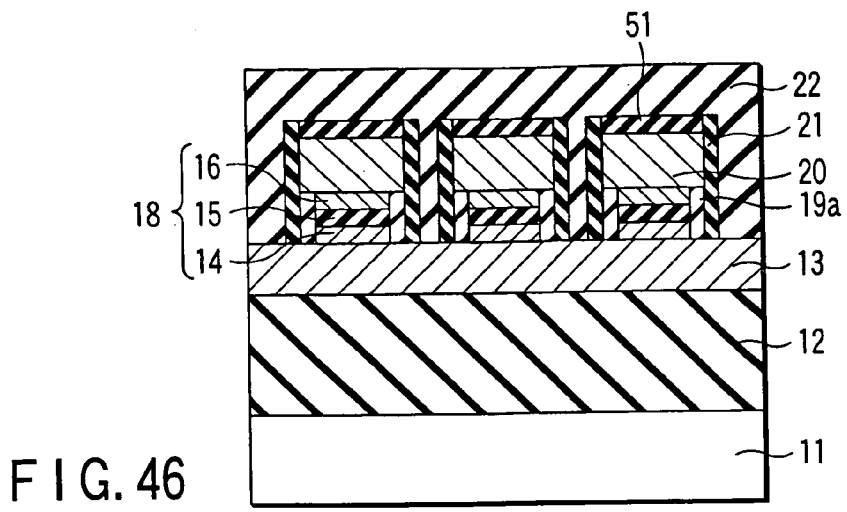
F I G. 46
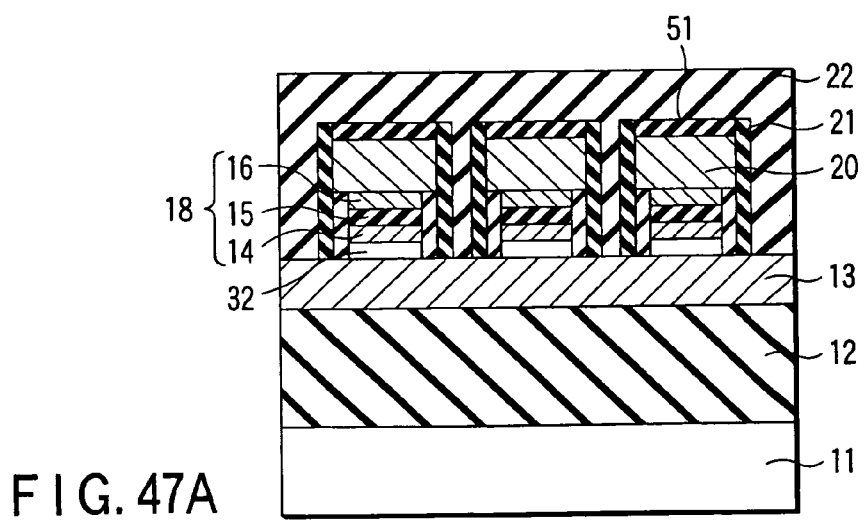
F I G. 47A
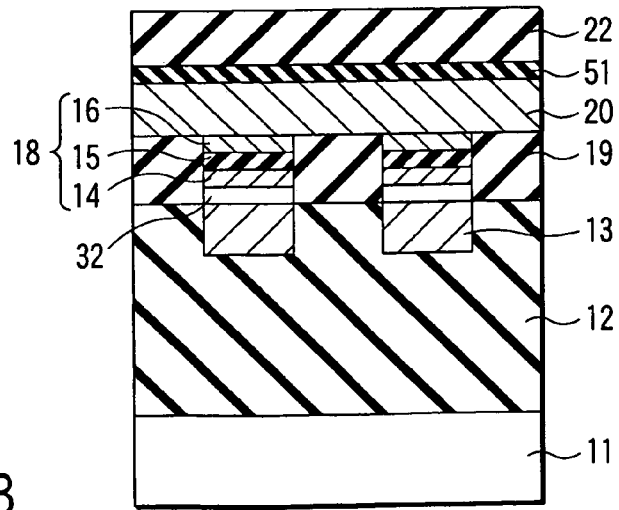
F I G. 47B

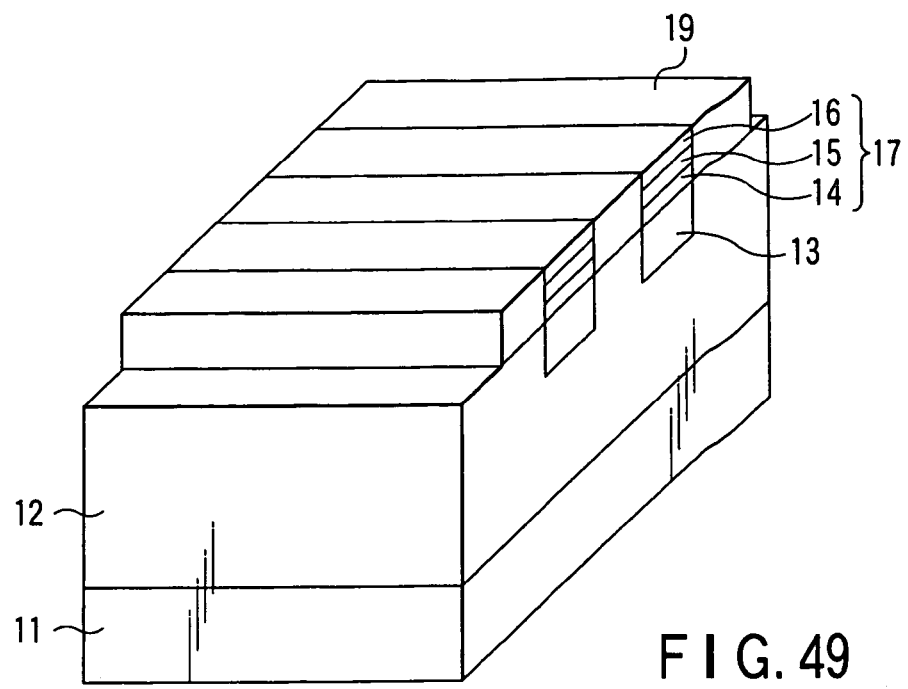
F I G. 49
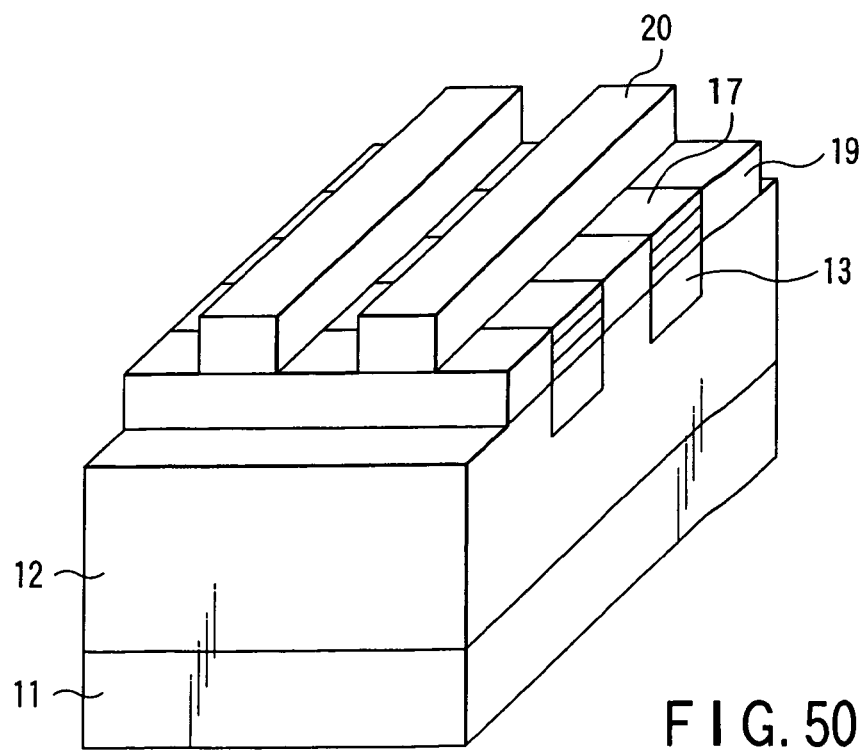
F I G. 50

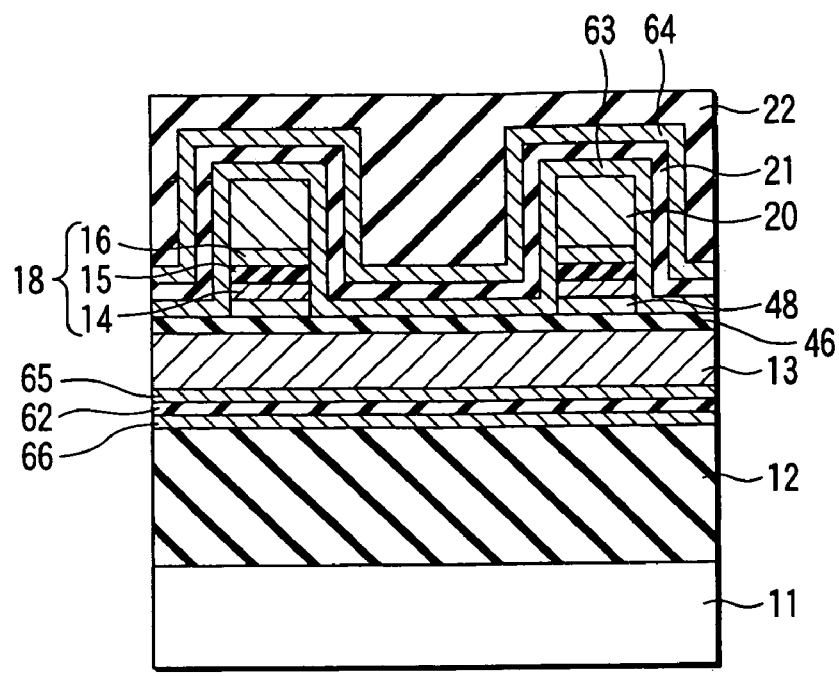
F I G. 58A
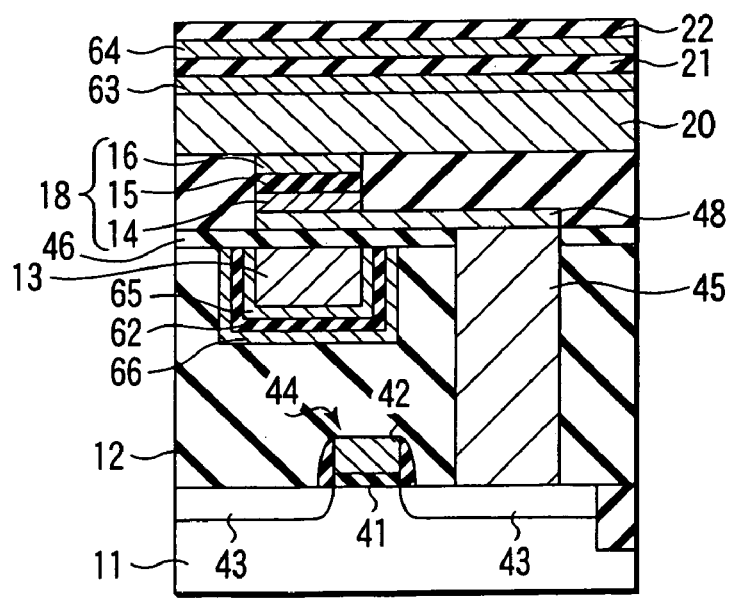
F I G. 58B

US 7,247,505 B2

MAGNETIC MEMORY DEVICE HAVING MAGNETIC SHIELD LAYER, AND MANUFACTURING METHOD THEREOF

CROSS-REFERENCE TO RELATED APPLICATIONS

This application is based upon and claims the benefit of priority from the prior Japanese Patent Application No. 2001-384793, filed Dec. 18, 2001, and also claims the benefit under 35 USC §120 of application Ser. No. 10/317, 141, filed on Dec. 12, 2002 now U.S. Pat. No. 6,997,401, the entire contents of which are incorporated herein by reference.

BACKGROUND OF THE INVENTION

1. Field of the Invention

The present invention relates to a magnetic memory device and a manufacturing method thereof and, more particularly, to a magnetic memory device which performs write by a current magnetic field every bit and reads out information of "1" or "0" in response to a resistance change corresponding to the magnetization state of a cell, and a manufacturing method thereof.

2. Description of the Related Art

MRAM (Magnetic Random Access Memory) utilizing the magneto resistive effect have recently been proposed as a memory element. The feature of the MRAM is that to write data in a memory cell, the magnetization direction of a ferromagnet is-changed using a current magnetic field. Of MRAM, an MTJ (Magnetic Tunneling Junction) element using the TMR (Tunneling Magneto Resistive) effect can extract information of "1" or "0" in response to a change in resistance value. The MR (Magneto Resistive) ratio of the MTJ element as a resistance difference between "1" and "0" almost reaches 50%, which greatly promotes the practical use of MRAM.

To generate an information writable current magnetic field in a memory cell having a magneto resistive element such as an MTJ element, a sufficiently large write current must be supplied to write wiring. At present, the write current reaches about several mA to 10 mA per write wiring line. A further shrink in feature size shortens the distance between magneto resistive elements. This means generation of a large write current influences cells adjacent to a selected cell.

One of techniques which solve this problem is "magnetic shield". According to this technique, only current magnetic field wiring or both current magnetic field wiring line and a magneto resistive element are covered with a magnetic member. A magnetic field generated by the current magnetic field wiring is concentrated on a selected cell by the same effect as that of a yoke. Information can be written in the selected cell by a small write current.

A known example of this technique is one disclosed in Jpn. Pat. Appln. Publication No. 11-238377. In this example, as shown in FIG. 61, element isolation oxide films 72 are selectively formed on a semiconductor substrate 71. A MOSFET 73 is selectively formed between the element isolation oxide films 72. The source/drain diffusion layer of the MOSFET 73 is connected to a GMR (Giant Magneto Resistive) element 80 via contacts 74, 76, and 78, and first, second, and third wiring layers 75, 77, and 79. Upper and lower word lines 81 and 82 for writing information in the GMR element 80 by a current magnetic field are formed above and below the GMR element 80 at intervals from the GMR element 80. A magnetic shield layer 83 made of a nonconductive ferrite material is formed as a passivation film which covers the entire surface of a memory cell array.

The prior art can shield a stray magnetic field outside the magnetic shield layer 83 by the non-conductive ferrite material. The prior art can also concentrate a magnetic field generated by the write wiring lines 81 and 82 on the magnetic layer of the GMR element 80 serving as a recording portion.

The prior art, however, has a poor effect of preventing erroneous write caused by a magnetic field which leaks between adjacent cells in a downsized magnetic memory. The prior art cannot satisfactorily concentrate a magnetic field by the current magnetic field wiring on the magnetic member.

BRIEF SUMMARY OF THE INVENTION

A magnetic memory device according to a first aspect of the present invention comprises a first wiring layer which runs in a first direction, a memory element which is arranged above the first wiring layer, second wiring layers which are arranged on the memory element and run in a second direction different from the first direction, and a first magnetic shield layer which is formed on a side surface of each second wiring layer and formed around a side surface of the memory element.

A magnetic memory device manufacturing method according to a second aspect of the present invention comprises forming a first wiring layer which runs in a first direction, selectively forming a memory element above the first wiring layer, forming a first insulating layer around the memory element, forming, on the first insulating layer and the memory element, second wiring layers which run in a second direction different from the first direction, removing a portion of the first insulating layer not covered with the second wiring layers by using the second wiring layers as a mask, and forming a first magnetic shield layer over the second wiring layers to cover the first and second wiring layers and the memory element.

BRIEF DESCRIPTION OF THE SEVERAL VIEWS OF THE DRAWING

FIG. 1A is a perspective view showing a magnetic memory device according to a first embodiment of the present invention;

FIG. 1B is a sectional view showing the magnetic memory device taken along the line IB-IB in FIG. 1A;

FIG. 1C is a sectional view showing the magnetic memory device taken along the line IC-IC in FIG. 1A;

FIGS. 2A and 2B are sectional views each showing an MTJ element with a single tunnel junction structure according to each embodiment of the present invention;

FIGS. 3A and 3B are sectional views each showing an MTJ element with a double tunnel junction structure according to each embodiment of the present invention;

FIG. 8A is a perspective view showing the step subsequent to FIG. 7A in manufacturing the magnetic memory device according to the first embodiment of the present invention;

FIG. 8B is a sectional view showing the magnetic memory device taken along the line VIIIB-VIIIB in FIG. 8A;

FIG. 8C is a sectional view showing the magnetic memory device taken along the line VIIIC-VIIIC in FIG. 8A;

FIGS. 17A, 18A, 19A, 20A, and 21A are sectional views showing the steps in manufacturing the magnetic memory device according to the third embodiment of the present invention in the direction in which the first wiring layer runs;

FIGS. 17B, 18B, 19B, 20B, and 21B are sectional views showing the steps in manufacturing the magnetic memory device according to the third embodiment of the present invention in the direction in which the second wiring layer runs;

FIG. 39 is a sectional view showing a magnetic memory device according to a ninth embodiment of the present invention;

FIG. 40 is a sectional view showing the step in manufacturing the magnetic memory device according to the ninth embodiment of the present invention;

FIG. 46 is a sectional view showing still another magnetic memory device according to the ninth embodiment of the present invention in which the magnetic shield layer is divided every second wiring layer and formed on the second wiring layer;

FIGS. 47A and 47B are sectional views showing still another magnetic memory device having a diode as a switching element according to the ninth embodiment of the present invention in which the magnetic shield layer is divided every second wiring layer and formed on the second wiring layer;

FIGS. 49, 50, 51, and 52 are perspective views showing the steps in manufacturing-a magnetic memory device according to a tenth embodiment of the present invention;

FIGS. 58A and 58B are sectional views showing a magnetic memory device having a MOSFET as a switching element according to the twelfth embodiment of the present invention;

DETAILED DESCRIPTION OF THE INVENTION

Figure 4A:
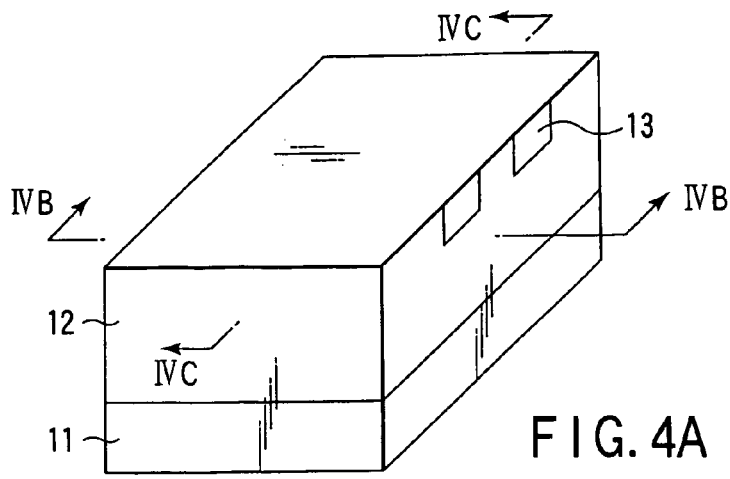
FIG. 4A is a perspective view showing the step in manufacturing the magnetic memory device according to the first embodiment of the present invention.

Preferred embodiments of the present invention relate to a magnetic memory device (MRAM: Magnetic Random Access Memory) which adopts an MTJ (Magnetic Tunneling Junction) element using the TMR (Tunneling Magneto Resistive) effect as a memory element.

Preferred embodiments of the present invention will be described below with reference to the several views of the accompanying drawing. In the following description, the same reference numerals denote the same parts throughout the accompanying drawing.

FIRST EMBODIMENT

In the first embodiment, a magnetic shield layer is formed over adjacent second wiring layers so as to cover an MTJ element and the second wiring layers. This embodiment does not use any switching element.

FIG. 1A is a perspective view showing a magnetic memory device according to the first embodiment of the present invention. FIG. 1B is a sectional view showing the magnetic memory device taken along the line IB-IB in FIG. 1A. FIG. 1C is a sectional view showing the magnetic memory device taken along the line IC-IC in FIG. 1A. The structure of the magnetic memory device according to the first embodiment will be explained.

As shown in FIGS. 1A, 1B, and 1C, in the magnetic memory device according to the first embodiment, first and second wiring layers 13 and 20 run in different directions. Each MTJ element 18 electrically connected to corresponding first and second wiring layers 13 and 20 is arranged at the node between the first and second wiring layers 13 and 20 between the first and second wiring layers 13 and 20. A magnetic shield layer 21 is so formed as to cover the side surface of each MTJ element 18 and the upper and side surfaces of each second wiring layer 20. The magnetic shield layer 21 is continuously formed over adjacent second wiring layers 20.

A width X of the MTJ element 18 in a direction in which the first wiring layer 13 runs is equal to the width of the second wiring layer 20. A width Y of the MTJ element 18 in a direction in which the second wiring layer 20 runs is equal to the width of the first wiring layer 13. Hence, the side surface of the MTJ element 18 in the direction in which the second wiring layer 20 runs-and the side surface of the second wiring layer 20 in this direction form a plane almost free from any step. The magnetic shield layer 21 is so formed as to cover this plane. An interlayer dielectric film 19 fills the interval between MTJ elements 18. The film thicknesses of the interlayer dielectric film 19 and MTJ element 18 are almost equal to each other.

In the first embodiment, the magnetic shield layer 21 is continuously formed over adjacent second wiring layers 20. The magnetic shield layer 21 preferably uses an insulating material. This is because, if the magnetic shield layer 21 made of a conductive material is continuously formed over the second wiring layers 20, adjacent second wiring layers 20 are electrically connected via the magnetic shield layer 21 or the MTJ elements 18 isolated every cell are electrically connected.

That is, the magnetic shield layer 21 is an insulating magnetic layer. Examples of the material of the insulating magnetic layer are an insulating ferrite, and a metal-non-metallic nanogranular film such as a (Fe, Co)—(B, Si, Hf, Zr, Sm, Ta, Al)—(F, O, N) film. More specifically, the insulating ferrite consists of at least one material selected from the group consisting of Mn—Zn-ferrite, Ni—Zn-ferrite, MnFeO, CuFeO, FeO, and NiFeO.

In the first embodiment, the first and second wiring layers 13 and 20 cross each other suitably for formation of a large-scale cell array. However, the first and second wiring layers 13 and 20 may not cross each other as far as they run in different directions.

The MTJ element 18 is comprised of three layers: a magnetically fixed layer (magnetic layer) 14 whose magnetization direction is fixed, a tunnel junction layer (nonmagnetic layer) 15, and a magnetic recording layer (magnetic layer) 16 whose magnetization direction is reversed. The positions of the magnetically fixed layer 14 and magnetic recording layer 16 may be exchanged. The MTJ element 18 can take a single tunnel junction structure formed from one tunnel junction layer 15 or a double tunnel junction structure formed from two tunnel junction layers 15. MTJ elements 18 with single and double tunnel junction structures will be exemplified.

An MTJ element 18 with a single tunnel junction structure shown in FIG. 2A is constituted by a magnetically fixed layer 14 obtained by sequentially stacking a template layer 101, initial ferromagnetic layer 102, anti-ferromagnetic layer 103, and reference ferromagnetic layer 104, a tunnel junction layer 15 formed on the magnetically fixed layer 14, and a magnetic recording layer 16 obtained by sequentially stacking a free ferromagnetic layer 105 and contact layer 106 on the tunnel junction layer 15.

An MTJ element 18 with a single tunnel junction structure shown in FIG. 2B is constituted by a magnetically fixed layer 14 obtained by sequentially stacking a template layer 101, initial ferromagnetic layer 102, anti-ferromagnetic layer 103, ferromagnetic layer 104', nonmagnetic layer 107, and ferromagnetic layer 104", a tunnel junction layer 15 formed on the magnetically fixed layer 14, and a magnetic recording layer 16 obtained by sequentially stacking a ferromagnetic layer 105', nonmagnetic layer 107, ferromagnetic layer 105", and contact layer 106 on the tunnel junction layer 15.

The MTJ element 18 shown in FIG. 2B introduces a three-layered structure made up of the ferromagnetic layer 104', nonmagnetic layer 107, and ferromagnetic layer 104" in the magnetically fixed layer 14, and a three-layered structure made up of the ferromagnetic layer 105', nonmagnetic layer 107, and ferromagnetic layer 105" in the magnetic recording layer 16. This MTJ element 18 can provide a cell structure more suitable for miniaturization in which generation of a magnetic pole in a ferromagnet is suppressed, compared with the MTJ element 18 shown in FIG. 2A.

An MTJ element 18 with a double tunnel junction structure shown in FIG. 3A is constituted by a first magnetically fixed layer 14a obtained by sequentially stacking a template layer 101, initial ferromagnetic layer 102, anti-ferromagnetic layer 103, and reference ferromagnetic layer 104, a first tunnel junction layer 15a formed on the first magnetically fixed layer 14a, a magnetic recording layer 16 formed on the first tunnel junction layer 15a, a second tunnel junction layer 15b formed on the magnetic recording layer 16, and a second magnetically fixed layer 14b obtained by sequentially stacking a reference ferromagnetic layer 104, anti-ferromagnetic layer 103, initial ferromagnetic layer 102, and contact layer 106 on the second tunnel junction layer 15b.

An MTJ element 18 with a double tunnel junction structure shown in FIG. 3B is constituted by a first magnetically fixed layer 14a obtained by sequentially stacking a template layer 101, initial ferromagnetic layer 102, anti-ferromagnetic layer 103, and reference ferromagnetic layer 104, a first tunnel junction layer 15a formed on the first magnetically fixed layer 14a, a magnetic recording layer 16 obtained by sequentially stacking a ferromagnetic layer 16', nonmagnetic layer 107, and ferromagnetic layer 16" on the first tunnel junction layer 15a, a second tunnel junction layer 15b formed on the magnetic recording layer 16, and a second magnetically fixed layer 14b obtained by sequentially stacking a ferromagnetic layer 104', nonmagnetic layer 107, ferromagnetic layer 104", anti-ferromagnetic layer 103, initial ferromagnetic layer 102, and contact layer 106 on the second tunnel junction layer 15b.

The MTJ element 18 shown in FIG. 3B introduces a three-layered structure of the ferromagnetic layer 16', nonmagnetic layer 107, and ferromagnetic layer 16" which constitute the magnetic recording layer 16, and a three-layered structure made up of the ferromagnetic layer 104', nonmagnetic layer 107, and ferromagnetic layer 104" in the second magnetically fixed layer 14b. This MTJ element 18 can provide a cell structure more suitable for miniaturization in which generation of a magnetic pole in a ferromagnet is suppressed, compared with the MTJ element 18 shown in FIG. 3A.

The MTJ element 18 with such a double tunnel junction structure can operate at a higher bias with a smaller decrease in MR (Magneto Resistive) ratio (resistance change ratio between states "1" and "0") upon application of the same external bias than the MTJ element 18 with a single tunnel junction structure. The double tunnel junction structure is more advantageous to reading out information from a cell.

The MTJ element 18 with a single or double tunnel junction structure is formed using, e.g., the following materials.

Examples of the materials of the magnetically fixed layers 14, 14a, and 14b and magnetic recording layer 16 are Fe, Co, Ni, and an alloy of them, magnetite with a high spin polarizability, oxides such as $CrO_2$ and $RXMnO_{3-y}$ (R; rare-earth element, X; Ca, Ba, Cr), and Heusler alloys such as NiMnSb an PtMnSb. These magnetic materials may slightly contain a nonmagnetic element such as Ag, Cu, Au, Al, Mg, Si, Bi, Ta, B, C, O, N, Pd, Pt, Zr, Ir, W, Mo, or Nb as long as they do not lose ferromagnetism.

Preferable examples of the material of the anti-ferromagnetic layer 103 which constitutes part of the magnetically fixed layer 14, 14a, or 14b are Fe—Mn, Pt—Mn, Pt—Cr—Mn, Ni—Mn, Ir—Mn, NiO, and $Fe_2O_3$.

Examples of the material of the tunnel junction layers 15, 15a, and 15b are various dielectrics such as $Al_2O_3$, $SiO_2$, MgO, AlN, $Bi_2O_3$, $MgF_2$, $CaF_2$, $SrTiO_2$, and $AlLaO_3$. These dielectrics may contain an oxygen, nitrogen, or fluorine defect.

FIGS. 4A, 4B, 4C to FIGS. 9A, 9B, and 9C show the steps in manufacturing the magnetic memory device according to the first embodiment of the present invention. A magnetic memory device manufacturing method according to the first embodiment will be described.

Figure 4B:
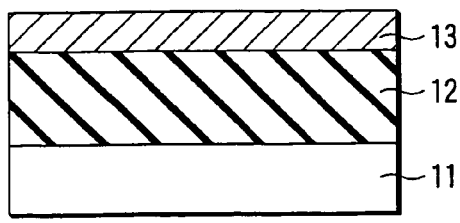
FIG. 4B is a sectional view showing the magnetic memory device taken along the line IVB-IVB in FIG. 4A.
Figure 4C:
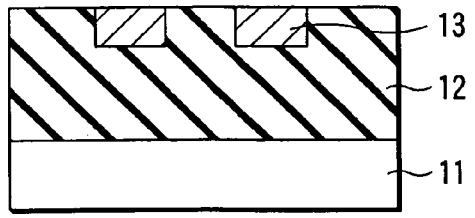
FIG. 4C is a sectional view showing the magnetic memory device taken along the line IVC-IVC in FIG. 4A.

As shown in FIGS. 4A, 4B, and 4C, a first interlayer dielectric film 12 and first wiring layer 13 are formed on a semiconductor substrate 11. More specifically, the first wiring layer 13 is formed into a desired pattern using RIE (Reactive Ion Etching). The first interlayer dielectric film 12 is formed on the first wiring layer 13. The first interlayer dielectric film 12 is planarized using CMP (Chemical Mechanical Polish) or etch-back until the surface of the first wiring layer 13 is exposed.

Figure 5A:
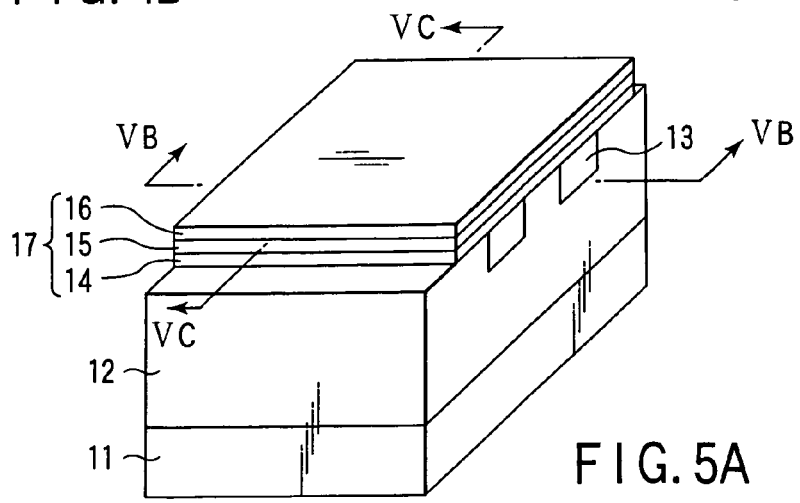
FIG. 5A is a perspective view showing the step subsequent to FIG. 4A in manufacturing the magnetic memory device according to the first embodiment of the present invention.
Figure 5B:
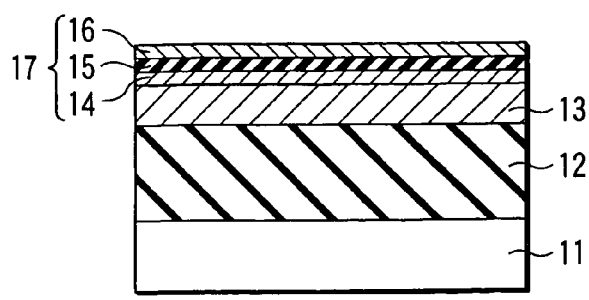
FIG. 5B is a sectional view showing the magnetic memory device taken along the line VB-VB in FIG. 5A.
Figure 5C:
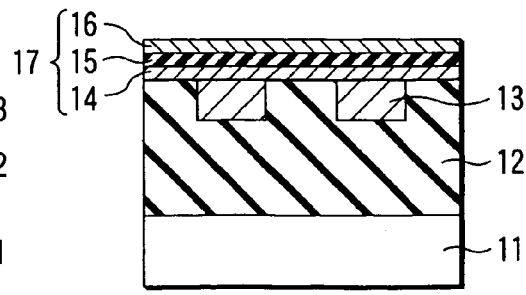
FIG. 5C is a sectional view showing the magnetic memory device taken along the line VC-VC in FIG. 5A.

As shown in FIGS. 5A, 5B, and 5C, a magnetically fixed layer 14 is deposited on the first interlayer dielectric film 12 and first wiring layer 13. A tunnel junction layer 15 is deposited on the magnetically fixed layer 14. A magnetic recording layer 16 is deposited on the tunnel junction layer 15. The magnetically fixed layer 14, tunnel junction layer 15, and magnetic recording layer 16 form a TMR material layer 17.

Figure 6A:
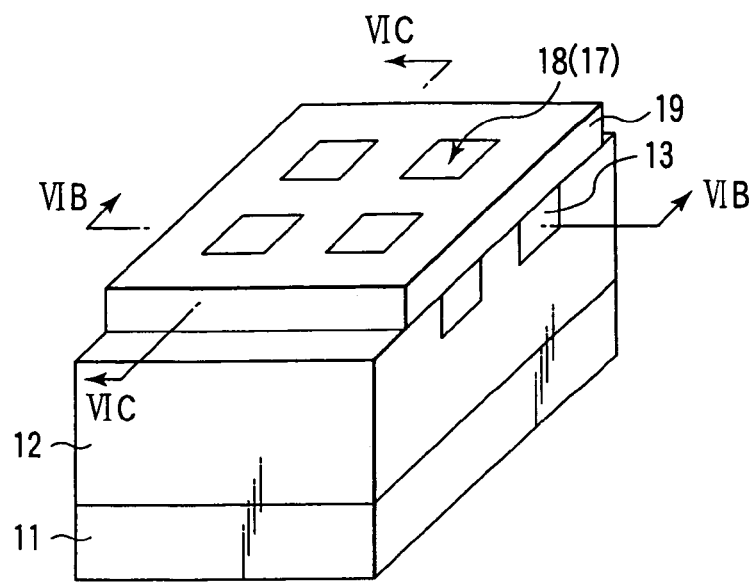
FIG. 6A is a perspective view showing the step subsequent to FIG. 5A in manufacturing the magnetic memory device according to the first embodiment of the present invention.
Figure 6B:
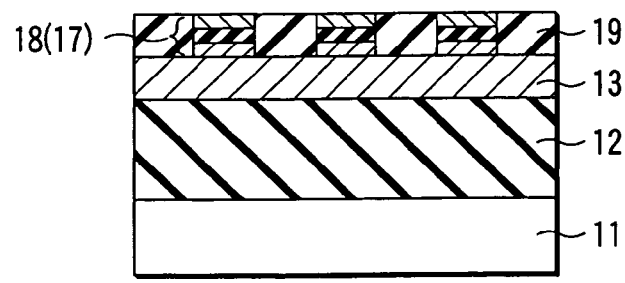
FIG. 6B is a sectional view showing the magnetic memory device taken along the line VIB-VIB in FIG. 6A.
Figure 6C:
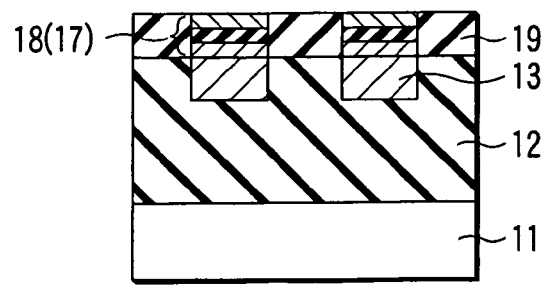
FIG. 6C is a sectional view showing the magnetic memory device taken along the line VIC-VIC in FIG. 6A.

As shown in FIGS. 6A, 6B, and 6C, the TMR material layer 17 is selectively etched using a mask (not shown) to form island-like MTJ elements 18 isolated every cell. A second interlayer dielectric film 19 is formed on the first interlayer dielectric film 12, MTJ elements 18, and first wiring layer 13. The second interlayer dielectric film 19 is planarized using CMP or etch-back until the surface of each MTJ element 18 is exposed.

Figure 7A:
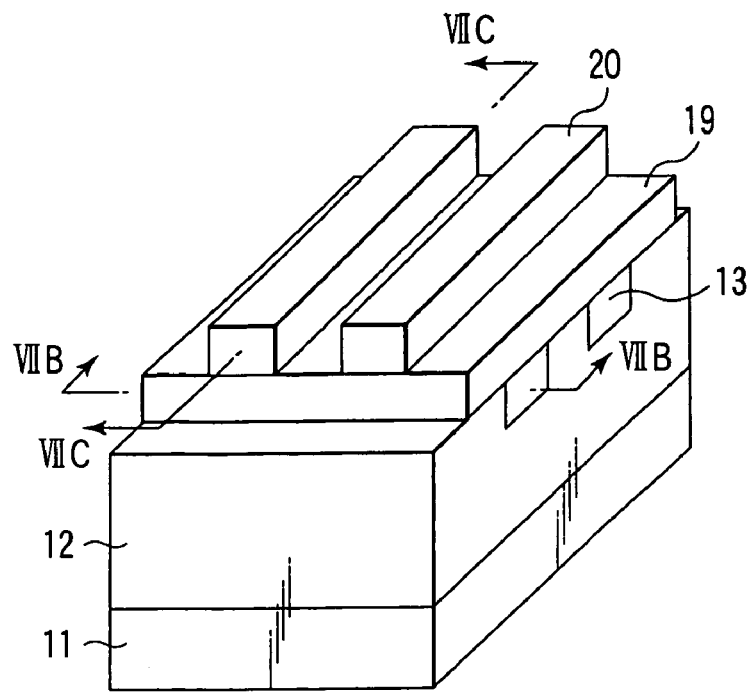
FIG. 7A is a perspective view showing the step subsequent to FIG. 6A in manufacturing the magnetic memory device according to the first embodiment of the present invention.
Figure 7B:
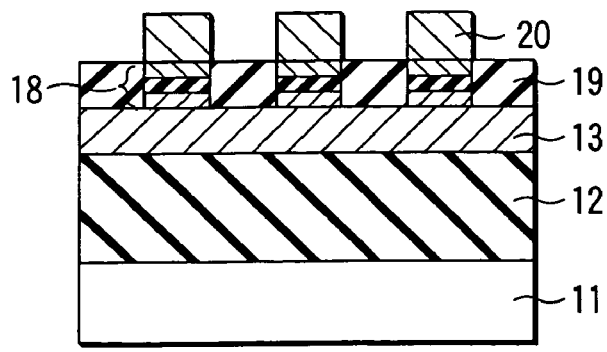
FIG. 7B is a sectional view showing the magnetic memory device taken along the line VIIB-VIIB in FIG. 7A.
Figure 7C:
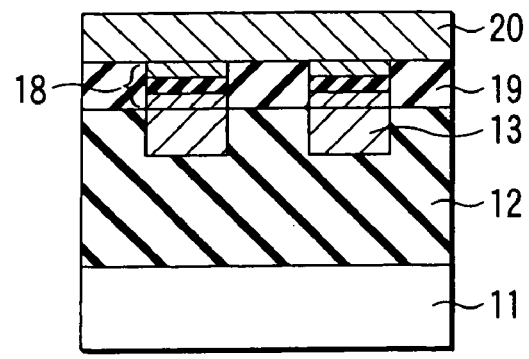
FIG. 7C is a sectional view showing the magnetic memory device taken along the line VIIC-VIIC in FIG. 7A.

As shown in FIGS. 7A, 7B, and 7C, second wiring layers 20 are formed on the MTJ elements 18 and second interlayer dielectric film 19 perpendicularly to the direction in which the first wiring layer 13 runs.

As shown in FIGS. 8A, 8B, and 8C, the second interlayer dielectric film 19 exposed between the second wiring layers 20 is removed using the second wiring layers 20 as a mask until the first interlayer dielectric film 12 and first wiring layer 13 are exposed.

Figure 9A:
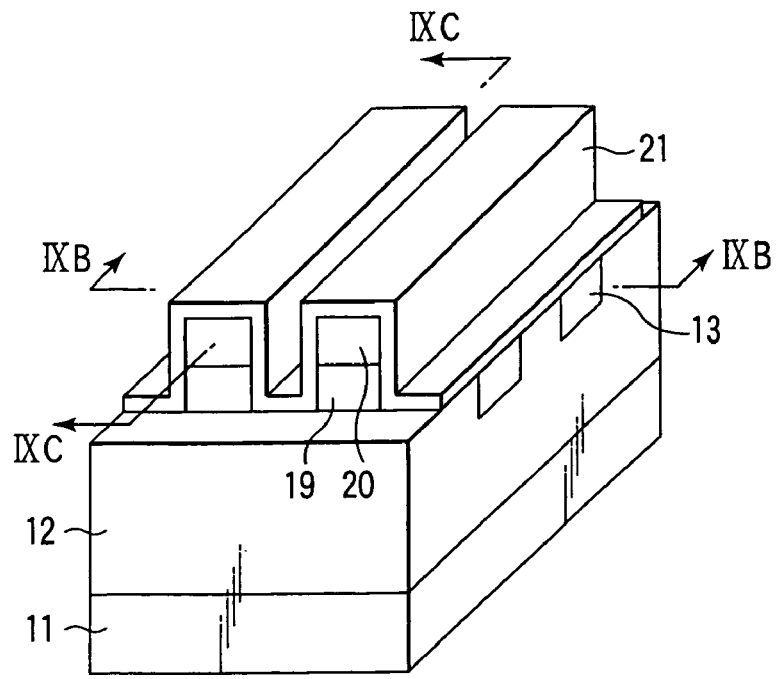
FIG. 9A is a perspective view showing the step subsequent to FIG. 8A in manufacturing the magnetic memory device according to the first embodiment of the present invention.
Figure 9B:
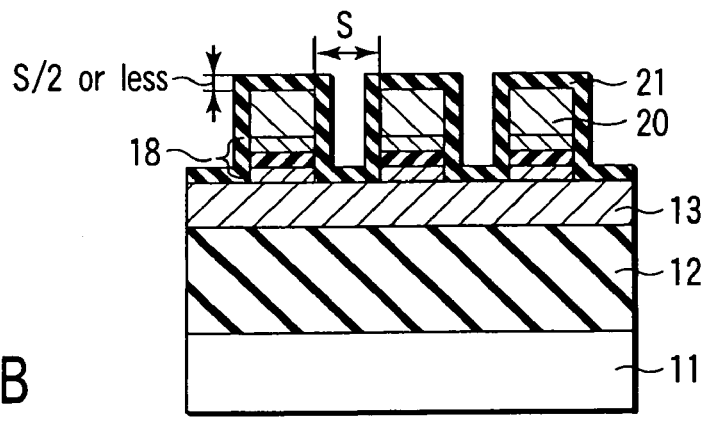
FIG. 9B is a sectional view showing the magnetic memory device taken along the line IXB-IXB in FIG. 9A.
Figure 9C:
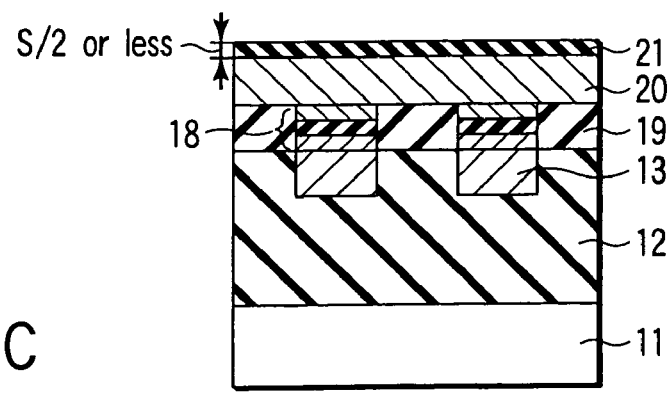
FIG. 9C is a sectional view showing the magnetic memory device taken along the line IXC-IXC in FIG. 9A.

As shown in FIGS. 9A, 9B, and 9C, a magnetic shield layer 21 is formed on the second wiring layers 20, first interlayer dielectric film 12, and first wiring layer 13. The film thickness of the magnetic shield layer 21 is desirably ½ a space S between the second wiring layers 20 in order to prevent contact of the magnetic shield layer 21 which covers the side surface of an adjacent second wiring layer 20.

As shown in FIGS. 1A, 1B, and 1C, a third interlayer dielectric film 22 is deposited on the magnetic shield layer 21, completing an MRAM memory cell array.

In the MRAM using the MTJ element 18 as a memory element, data is written and read out as follows.

In data write, a write current is supplied to both selected first and second wiring layers 13 and 20 to generate current magnetic fields. A combined magnetic field of the two current magnetic fields is applied to an MTJ element 18 at the node between the first and second wiring layers 13 and 20. The magnetization of the magnetic recording layer 16 lower in magnetization switching threshold than the magnetically fixed layer 14 is switched. The magnetization directions of the magnetically fixed layer 14 and magnetic recording layer 16 become parallel to each other (e.g., a state "0") or anti-parallel to each other (e.g., a state "1").

In data read, a current is supplied to the MTJ element 18 in which the state "0" or "1" i is written. Whether data is "1" or "0" is determined based on the difference in the resistance value of the MTJ element 18.

According to the first embodiment, the magnetic shield layer 21 covers the upper and side surfaces of the second wiring layer 20, and the side surface of the MTJ element 18 in which data is written using the second wiring layer 20. The magnetic shield layer 21 sufficiently exhibits a yoke effect and allows efficient application of a current magnetic field generated by the second wiring layer 20 to a selected cell. Since the write current can be reduced, an MRAM capable of reducing power consumption can be provided.

By covering the second wiring layer 20 and MTJ element 18 with the magnetic shield layer 21, a magnetic field which leaks to adjacent MTJ elements 18 arranged in the direction in which the first wiring layer 13 runs can be efficiently shielded to suppress erroneous write.

With the use of the insulating magnetic shield layer 21, the magnetic shield layer 21 need not be divided between adjacent second wiring layers 20. The distance between the second wiring layers 20 need not be large, and the memory cell can be shrunk in feature size.

The first embodiment employs the MTJ element 18 as a memory element. This embodiment can attain a larger read signal and a higher read operation speed in comparison with the use of a GMR (Giant Magneto Resistive) element formed from two magnetic layers and a conductive layer sandwiched between them.

The first and second wiring layers 13 and 20, MTJ element 18, and second interlayer dielectric film 19 are formed in self-alignment, thus providing an MRAM suitable for miniaturization.

SECOND EMBODIMENT

In the second embodiment, a magnetic shield layer is formed over adjacent second wiring layers so as to cover an MTJ element and the second wiring layers. This embodiment uses a diode as a switching element.

Figure 10A:
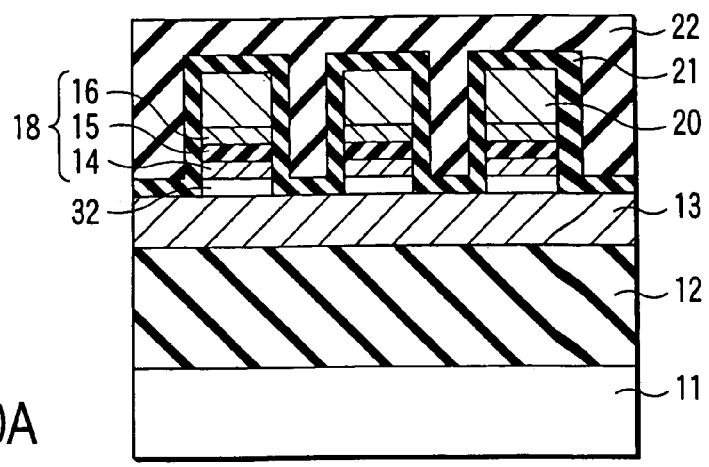
FIG. 10A is a sectional view showing a magnetic memory device according to a second embodiment of the present invention in a direction in which the first wiring layer runs.
Figure 10B:
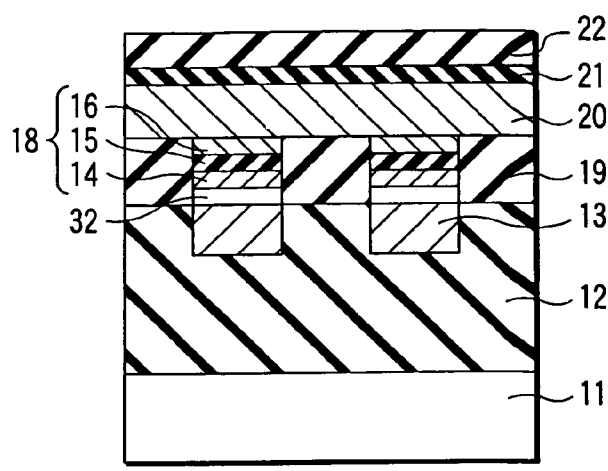
FIG. 10B is a sectional view showing the magnetic memory device according to the second embodiment of the present invention in a direction in which the second wiring layer runs.

FIGS. 10A and 10B are sectional views showing a magnetic memory device according to the second embodiment of the present invention. FIG. 10A is a sectional view showing the magnetic memory device along a direction in which the first wiring layer runs. FIG. 10B is a sectional view showing the magnetic memory device along a direction in which the second wiring layer runs. The structure of the magnetic memory device according to the second embodiment will be explained. Note that only a structure different from that of the first embodiment will be explained.

As shown in FIGS. 10A and 10B, in the second embodiment, a diode 32 is interposed as a read current switching element between a first wiring layer 13 and an MTJ element 18. The diode 32 has almost the same shape as that of the MTJ element 18. That is, the side surface of the diode 32 in a direction in which each second wiring layer 20 runs, the side surface of the MTJ element 18 in the direction in which the second wiring layer 20 runs, and the side surface of the second wiring layer 20 in this direction form a plane almost free from any step. A magnetic shield layer 21 is continuously formed on this plane and the upper surface of the second wiring layer 20 over adjacent second wiring layers 20.

The magnetic shield layer 21 suffices to be formed on at least the side surfaces of the second wiring layer 20 and MTJ element 18, and need not always be formed on the side surface of the diode 32. The magnetic shield layer 21 is continuously formed over adjacent second wiring layers 20, and desirably uses an insulating material.

FIGS. 11A and 11B to FIGS. 15A and 15B are sectional views showing the steps in manufacturing the magnetic memory device according to the second embodiment of the present invention. A magnetic memory device manufacturing method according to the second embodiment will be described. The same steps as those of the first embodiment will be explained briefly.

Figure 11A:
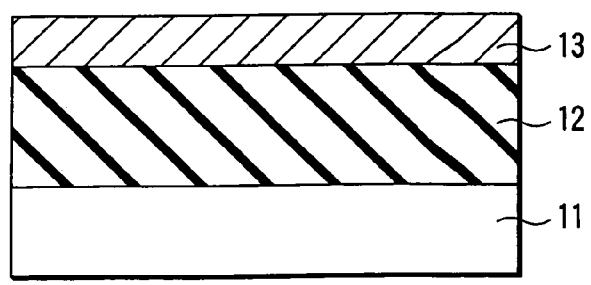
FIGS. 11A, 12A, 13A, 14A, and 15A are sectional views showing the steps in manufacturing the magnetic memory device according to the second embodiment of the present invention in the direction in which the first wiring layer runs.
Figure 11B:
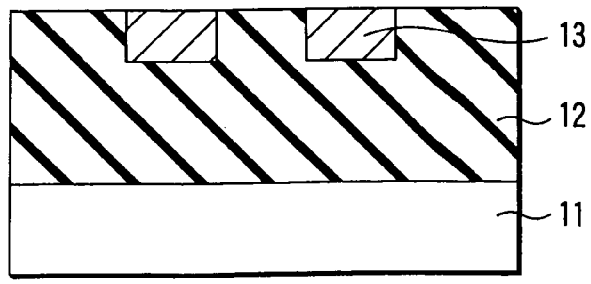
FIGS. 11B, 12B, 13B, 14B, and 15B are sectional views showing the steps in manufacturing the magnetic memory device according to the second embodiment of the present invention in the direction in which the second wiring layer runs.

As shown in FIGS. 11A and 11B, a first interlayer dielectric film 12 and first wiring layer 13 are formed on a semiconductor substrate 11.

Figure 12A:
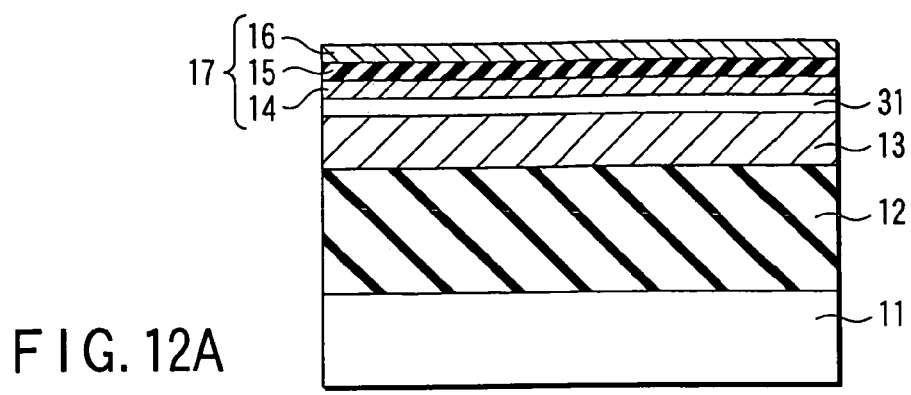
Figure 12B:
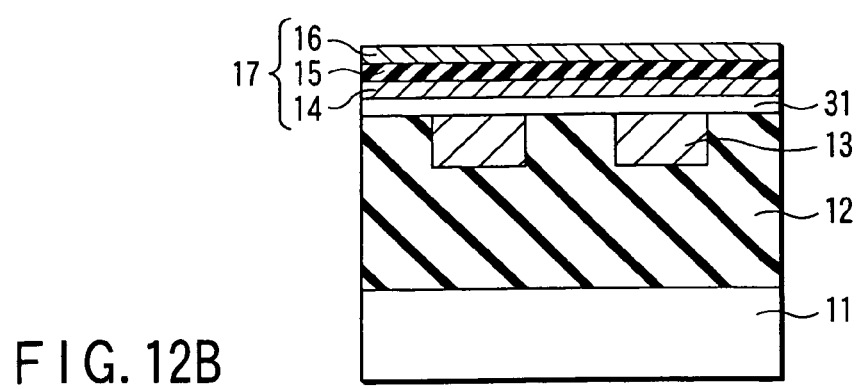

As shown in FIGS. 12A and 12B, a diode material layer 31 is formed on the first interlayer dielectric film 12 and first wiring layer 13. A TMR material layer 17 made up of a magnetically fixed layer 14, tunnel junction layer 15, and magnetic recording layer 16 is formed on the diode material layer 31.

Figure 13A:
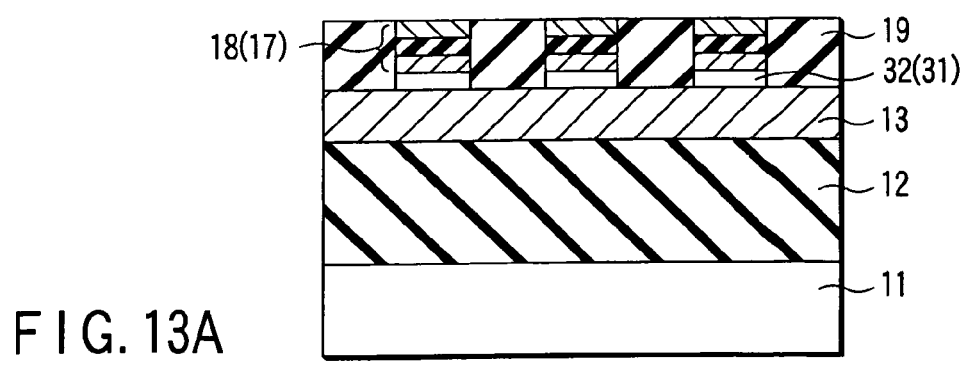
Figure 13B:
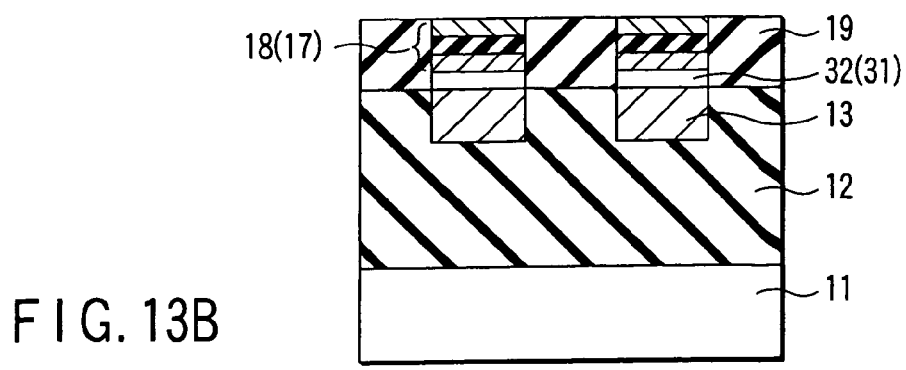

As shown in FIGS. 13A and 13B, the TMR material layer 17 and diode material layer 31 are selectively etched using a mask (not shown) to form island-like MTJ elements 18 and diodes 32 isolated in every cell. A second interlayer dielectric film 19 is formed on the MTJ elements 18 and first wiring layer 13. The second interlayer dielectric film 19 is planarized using CMP or etch-back until the surface of each MTJ element 18 is exposed.

Figure 14A:
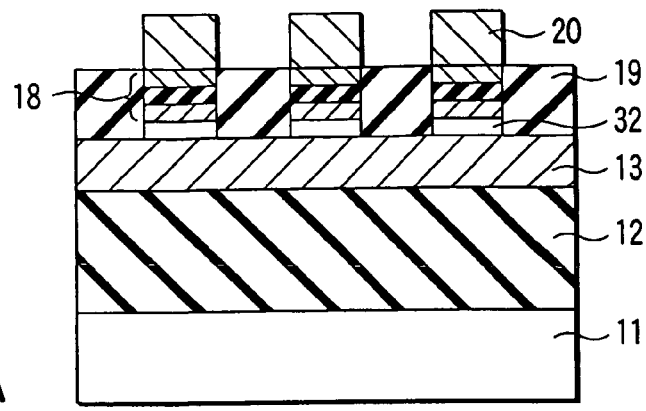
Figure 14B:
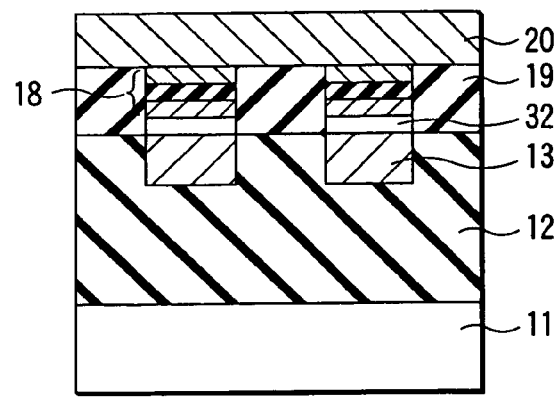

As shown in FIGS. 14A and 14B, second wiring layers 20 are formed on the MTJ elements 18 and second interlayer dielectric film 19 perpendicularly to the direction in which the first wiring layer 13 runs.

Figure 15A:
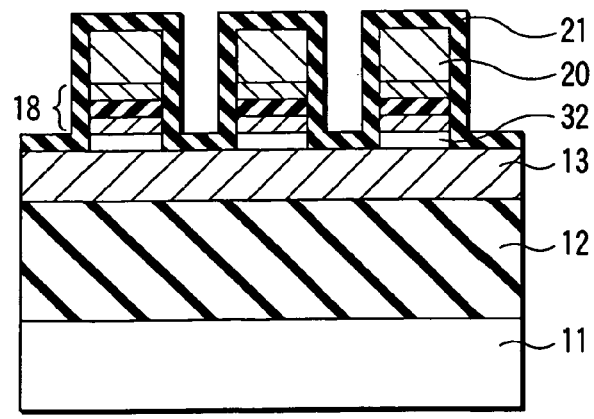
Figure 15B:
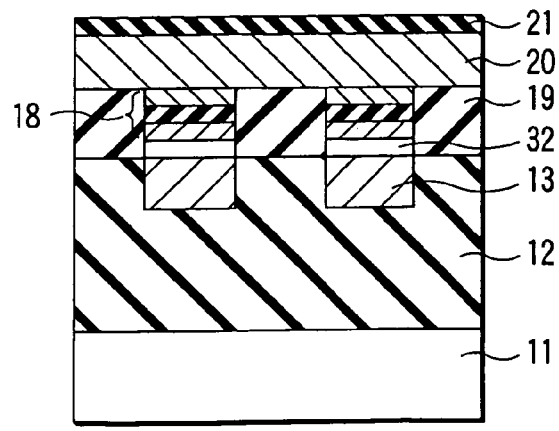

As shown in FIGS. 15A and 15B, the second interlayer dielectric film 19 exposed between the second wiring layers 20 is removed using the second wiring layers 20 as a mask until the first interlayer dielectric film 12 and first wiring layer 13 are exposed. After that, a magnetic shield layer 21 is formed on the second wiring layers 20, first interlayer dielectric film 12, and first wiring layer 13.

As shown in FIGS. 10A and 10B, a third interlayer dielectric film 22 is deposited on the magnetic shield layer 21, completing an MRAM memory cell array.

The second embodiment can obtain the same effects as those of the first embodiment, and in addition has the following effect.

The first embodiment adopts a matrix array structure, and a current may leak to a cell other than a selected sell in data read. The leakage current may decrease the S/N (Signed to noise) ratio of a read signal or the read speed. In the second embodiment, the diode 32 is arranged as a switching element, and a read current can be supplied to only a selected cell using the rectification of the diode 32. The second embodiment can improve the S/N ratio of a read signal and increase the read speed.

Also, the diode 32 may be formed between the second wiring layer 20 and an MTJ element 18.

THIRD EMBODIMENT

In the third embodiment, a magnetic shield layer is formed over adjacent second wiring layers so as to cover an MTJ element and the second wiring layers. This embodiment uses a transistor as a switching element.

Figure 16A:
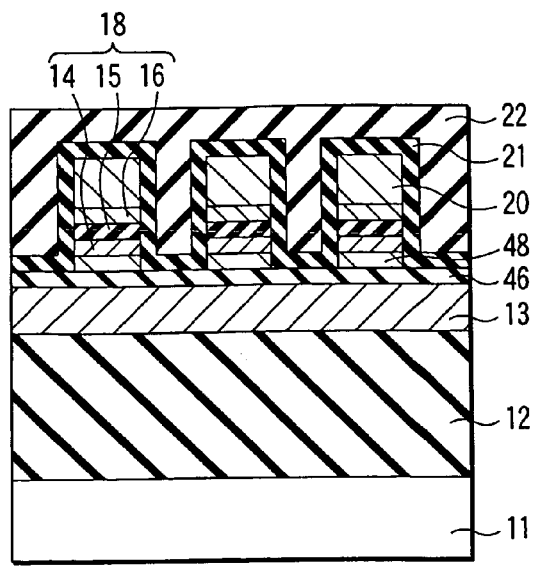
FIG. 16A is a sectional view showing a magnetic memory device according to a third embodiment of the present invention in the direction in which the first wiring layer runs.
Figure 16B:
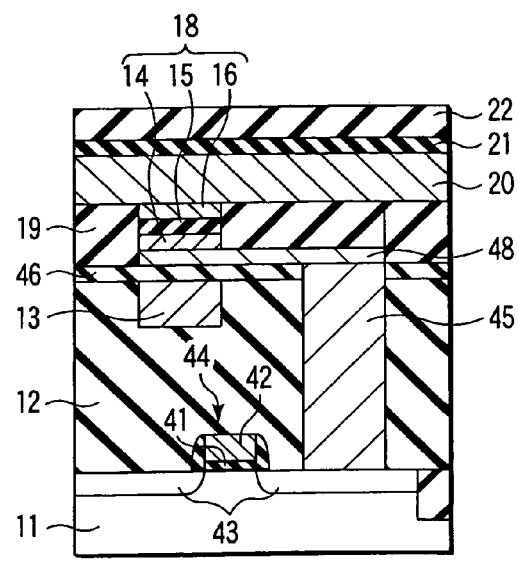
FIG. 16B is a sectional view showing the magnetic memory device according to the third embodiment of the present invention in the direction in which the second wiring layer runs.

FIGS. 16A and 16B are sectional views showing a magnetic memory device according to the third embodiment of the present invention. FIG. 16A is a sectional view showing the magnetic memory device along a direction in which the first wiring layer runs. FIG. 16B is a sectional view showing the magnetic memory device along a direction in which the second wiring layer runs. The structure of the magnetic memory device according to the third embodiment will be explained. Note that only a structure different from that of the first embodiment will be explained.

As shown in FIGS. 16A and 16B, in the third embodiment, a MOSFET 44 is arranged as a read current switching element. A contact 45 connected to a source/drain diffusion layer 43 of the MOSFET 44 is formed. A lower electrode 48 of an MTJ element 18 that is connected to the contact 45 is formed. The lower electrode 48 is spaced apart from a first wiring layer 13, and electrically connected to the MTJ element 18. The side surface of the lower electrode 48 in a direction in which each second wiring layer 20 runs, the side surface of the MTJ element 18 in the direction in which the second wiring layer 20 runs, and the side surface of the second wiring layer 20 in this direction form a plane almost free from any step. A magnetic shield layer 21 is continuously formed on this plane and the upper surface of the second wiring layer 20 over adjacent second wiring layers 20.

The magnetic shield layer 21 suffices to be formed on at least the side surfaces of the second wiring layer 20 and MTJ element 18, and need not always be formed on the side surface of the lower electrode 48. The magnetic shield layer 21 is continuously formed over adjacent second wiring layers 20, and desirably uses an insulating material.

FIGS. 17A and 17B to FIGS. 21A and 21B are sectional views showing the steps in manufacturing the magnetic memory device according to the third embodiment of the present invention. A magnetic memory device manufacturing method according to the third embodiment will be described. The same steps as those of the first embodiment will be explained briefly.

Figure 17A:
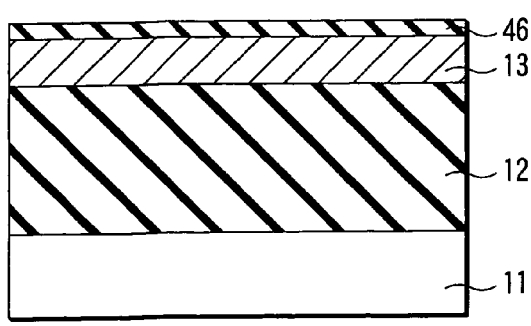
Figure 17B:
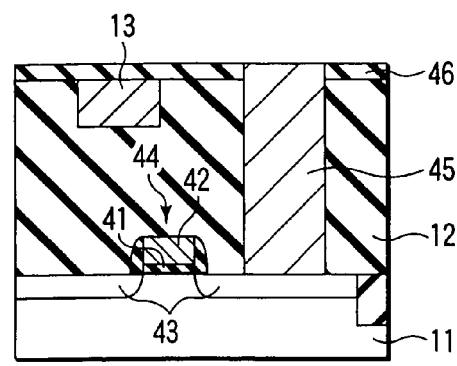

As shown in FIGS. 17A and 17B, a gate electrode 42 is selectively formed on a semiconductor substrate 11 via a gate insulating film 41. Source and drain diffusion layers 43 are formed on the two sides of the gate electrode 42 in the semiconductor substrate 11. As a result, a MOSFET 44 is formed as a switching element. A first interlayer dielectric film 12 and first wiring layer 13 are formed, and a fourth interlayer dielectric film 46 is formed on the first interlayer dielectric film 12 and first wiring layer 13. A contact 45 is formed and connected to the source/drain diffusion layer 43.

As shown in FIGS. 18A and 18B, a lower electrode material layer 47 is formed on the fourth interlayer dielectric film 46 and contact 45. A TMR material layer 17 made up of a magnetically fixed layer 14, tunnel junction layer 15, and magnetic recording layer 16 is formed on the lower electrode material layer 47.

As shown in FIGS. 19A and 19B, the TMR material layer 17 is selectively etched using a mask (not shown) to form island-like MTJ elements 18 isolated in every cell. The lower electrode material layer 47 is selectively etched to form lower electrodes 48 with a desired shape. A second interlayer dielectric film 19 is formed on the MTJ elements 18, lower electrodes 48, and fourth interlayer dielectric film 46. The second interlayer dielectric film 19 is planarized using CMP or etch-back until the surface of each MTJ element 18 is exposed.

Figure 20A:
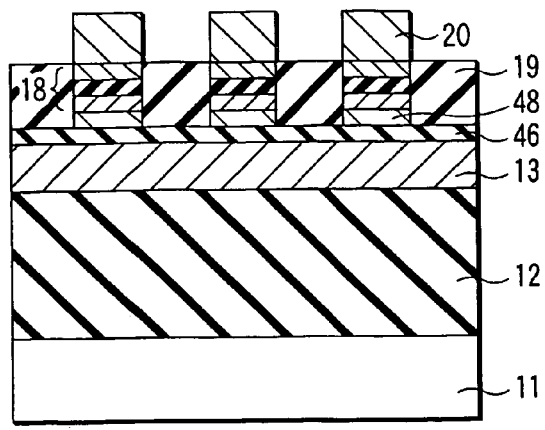
Figure 20B:
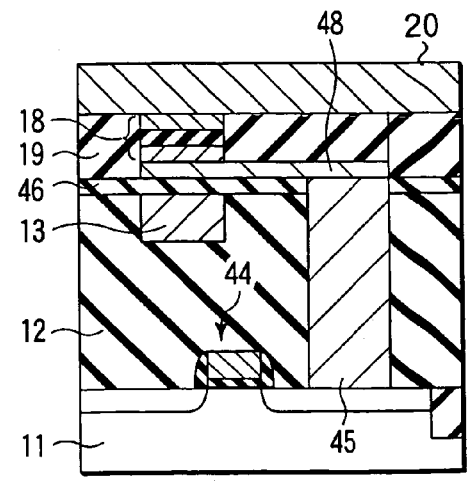

As shown in FIGS. 20A and 20B, second wiring layers 20 are formed on the MTJ elements 18 and second interlayer dielectric film 19 perpendicularly to the direction in which the first wiring layer 13 runs.

Figure 21A:
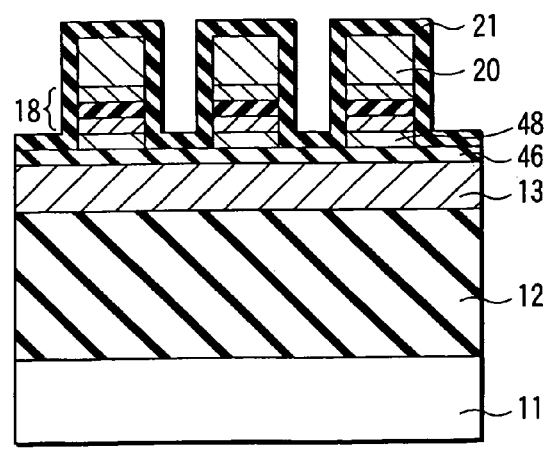
Figure 21B:
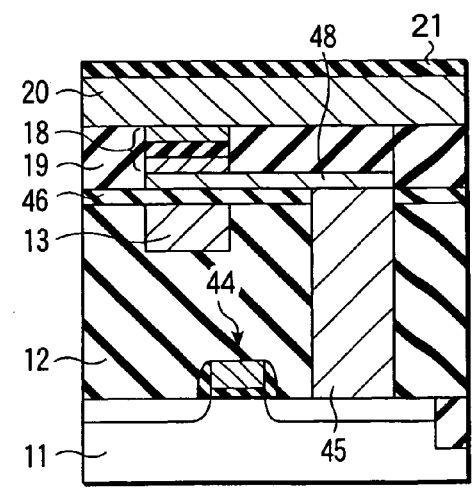

As shown in FIGS. 21A and 21B, the second interlayer dielectric film 19 exposed between the second wiring layers 20 is removed using the second wiring layers 20 as a mask until the fourth interlayer dielectric film 46 is exposed. A magnetic shield layer 21 is formed on the second wiring layers 20 and fourth interlayer dielectric film 46.

As shown in FIGS. 16A and 16B, a third interlayer dielectric film 22 is deposited on the magnetic shield layer 21, completing an MRAM memory cell array.

The third embodiment can obtain the same effects as those of the first embodiment, and further has the following effect.

The first embodiment adopts a matrix array structure, and a current may leak to a cell other than a selected sell in data read. The leakage current may decrease the S/N ratio of a read signal or the read speed. In the third embodiment, the MOSFET 44 is arranged as a switching element, and a read current can be supplied to only a selected cell. The third embodiment can improve the S/N ratio of a read signal and increase the read speed.

The read switch is the MOSFET 44, which is compatible with a general CMOS process. This read switch can be easily applied to a case where a memory cell as described in the third embodiment is built in a logic circuit.

FOURTH EMBODIMENT

The fourth embodiment is a modification of the first embodiment in which a magnetic shield layer is divided every second wiring layer.

Figure 22A:
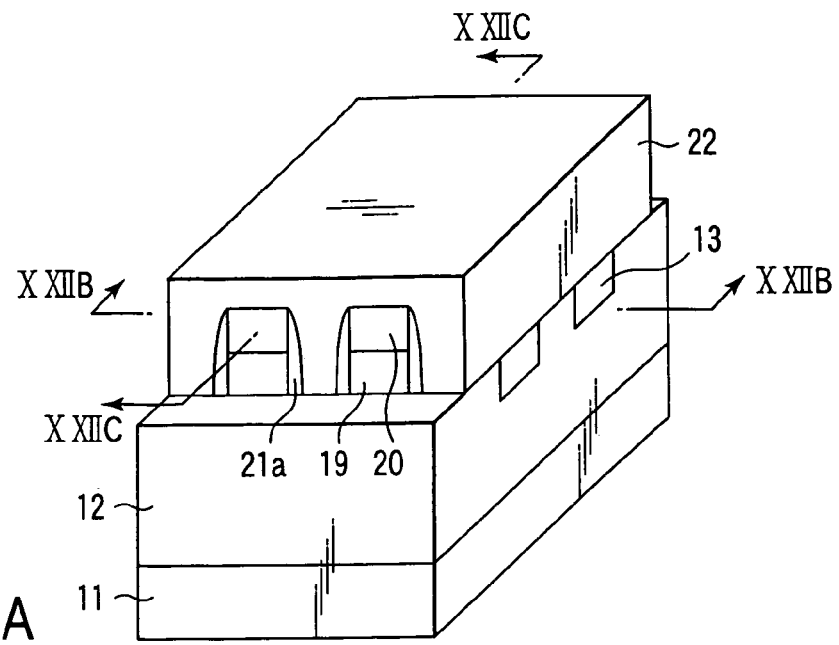
FIG. 22A is a perspective view showing a magnetic memory device according to a fourth embodiment of the present invention.
Figure 22B:
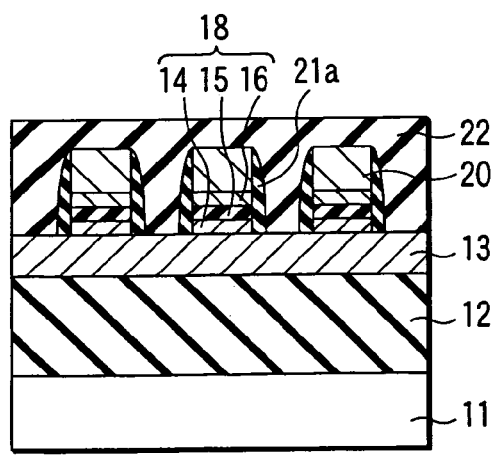
FIG. 22B is a sectional view showing the magnetic memory device taken along the line XXIIB-XXIIB in FIG. 22A.
Figure 22C:
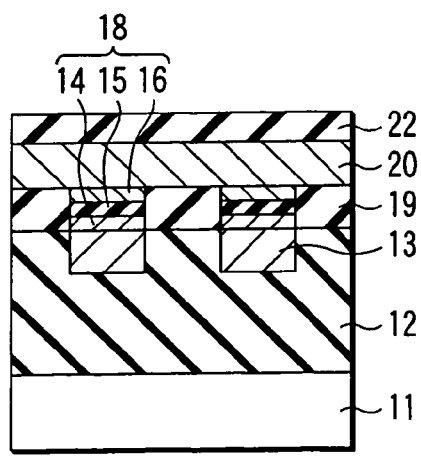
FIG. 22C is a sectional view showing the magnetic memory device taken along the line XXIIC-XXIIC in FIG. 22A.

FIG. 22A is a perspective view showing a magnetic memory device according to the fourth embodiment of the present invention. FIG. 22B is a sectional view showing the magnetic memory device taken along the line XXIIB-XXIIB in FIG. 22A. FIG. 22C is a sectional view showing the magnetic memory device taken along the line XXIIC-XXIIC in FIG. 22A. The structure of the magnetic memory device according to the fourth embodiment will be explained. Note that only a structure different from that of the first embodiment will be described.

As shown in FIGS. 22A, 22B, and 22C, in the fourth embodiment, a magnetic shield layer 21a is formed on only the side surfaces of each second wiring layer 20 and each MTJ element 18. No magnetic shield layer 21a is formed on each second wiring layer 20 or between adjacent second wiring layers 20. In other words, the magnetic shield layer 21a is divided every second wiring layer 20. The magnetic shield layer 21a desirably uses an insulating material in order to prevent short-circuiting between lower and upper magnetic layers 14 and 16 of the MTJ element 18.

Figure 23A:
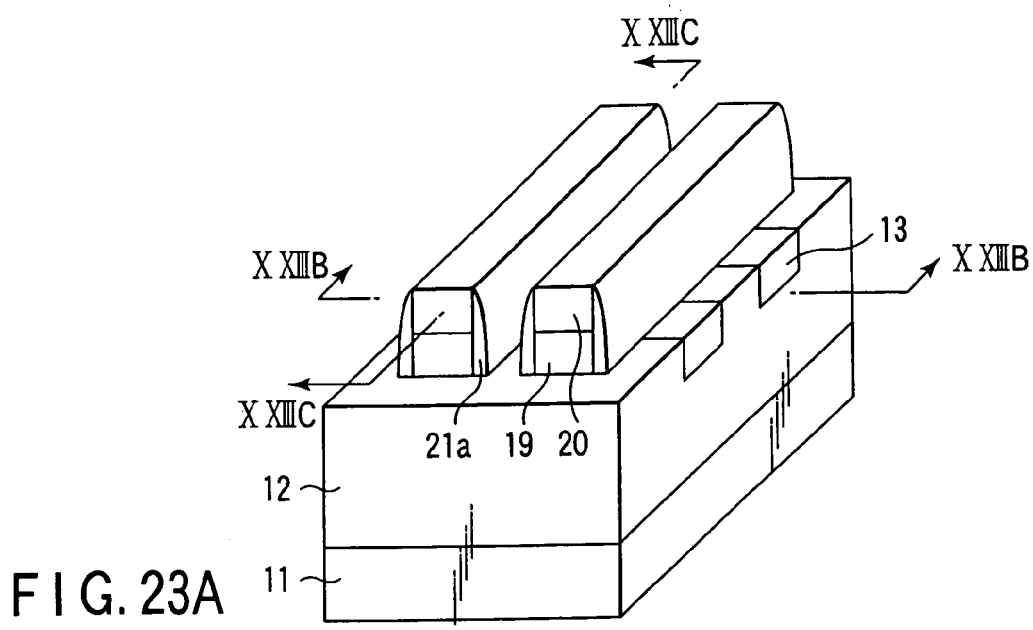
FIG. 23A is a perspective view showing the step in manufacturing the magnetic memory device according to the fourth embodiment of the present invention.
Figure 23B:
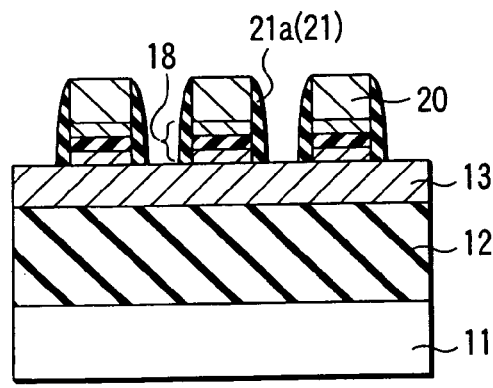
FIG. 23B is a sectional view showing the magnetic memory device taken along the line XXIIIB-XXIIIB in FIG. 23A.
Figure 23C:
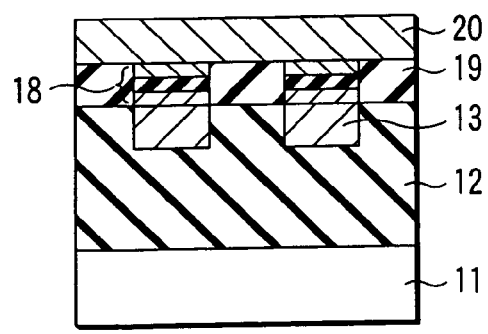
FIG. 23C is a sectional view showing the magnetic memory device taken along the line XXIIIC-XXIIIC in FIG. 23A.

FIGS. 23A, 23B, and 23C are a perspective view and sectional views, respectively, showing the steps in manufacturing the magnetic memory device according to the fourth embodiment of the present invention. A magnetic memory device manufacturing method according to the fourth embodiment will be described. A description of the same steps as those of the first embodiment will be omitted.

As shown in FIGS. 2A, 2B, 2C to FIGS. 9A, 9B, and 9C, a magnetic shield layer 21 is so formed as to cover the second wiring layer 20 and MTJ element 18.

As shown in FIGS. 23A, 23B, and 23C, the magnetic shield layer 21 formed on the upper surface of each second wiring layer 20 and the magnetic shield layer 21 formed on a first interlayer dielectric film 12 and first wiring layer 13 between the second wiring layers 20 are removed by vertical anisotropic etching such as RIE. The magnetic shield layer 21a is left on only the side surfaces of the MTJ element 18, a second interlayer dielectric film 19, and the second wiring layer 20.

As shown in FIGS. 22A, 22B, and 22C, a third interlayer dielectric film 22 is deposited on the magnetic shield layer 21a, second wiring layer 20, first wiring layer 13, and first interlayer dielectric film 12, completing an MRAM memory cell array.

The fourth embodiment can obtain the same effects as those of the first embodiment.

FIFTH EMBODIMENT

The fifth embodiment is a modification of the second embodiment in which a magnetic shield layer is divided every second wiring layer.

Figure 24A:
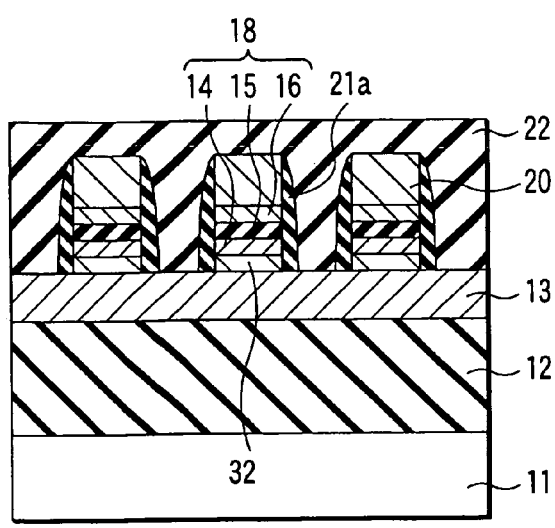
FIG. 24A is a sectional view showing a magnetic memory device according to a fifth embodiment of the present invention in the direction in which the first wiring layer runs.
Figure 24B:
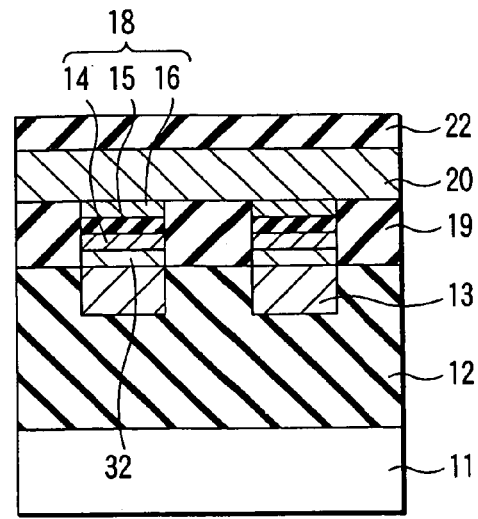
FIG. 24B is a sectional view showing the magnetic memory device according to the fifth embodiment of the present invention in the direction in which the second wiring layer runs.

FIGS. 24A and 24B are sectional views showing a magnetic memory device according to the fifth embodiment of the present invention. FIG. 24A is a sectional view showing the magnetic memory device along a direction in which the first wiring layer runs. FIG. 24B is a sectional view showing the magnetic memory device along a direction in which the second wiring layer runs. The structure of the magnetic memory device according to the fifth embodiment will be explained. Note that only a structure different from that of the second embodiment will be described.

As shown in FIG. 24A and 24B, in the fifth embodiment, a magnetic shield layer 21a is formed on only the side surfaces of each diode 32, each second wiring layer 20, and each MTJ element 18. No magnetic shield layer 21a is formed on each second wiring layer 20 or between adjacent second wiring layers 20. That is, the magnetic shield layer 21a is divided every second wiring layer 20. The magnetic shield layer 21a desirably uses an insulating material in order to prevent short-circuiting between lower and upper magnetic layers 14 and 16 of the MTJ element 18.

The magnetic shield layer 21a suffices to be formed on at least the side surfaces of the second wiring layer 20 and MTJ element 18, and need not always be formed on the side surface of the diode 32.

Figure 25A:
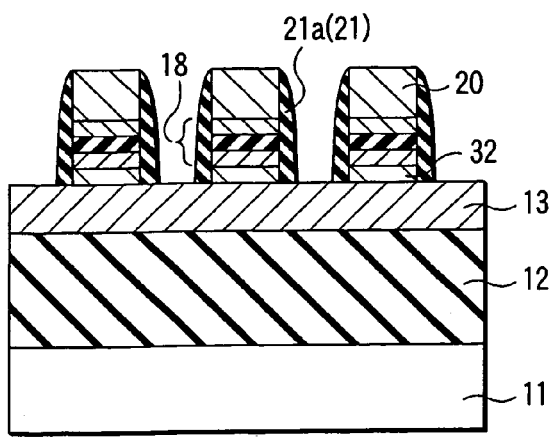
FIG. 25A is a sectional view showing the step in manufacturing the magnetic memory device according to the fifth embodiment of the present invention in the direction in which the first wiring layer runs.
Figure 25B:
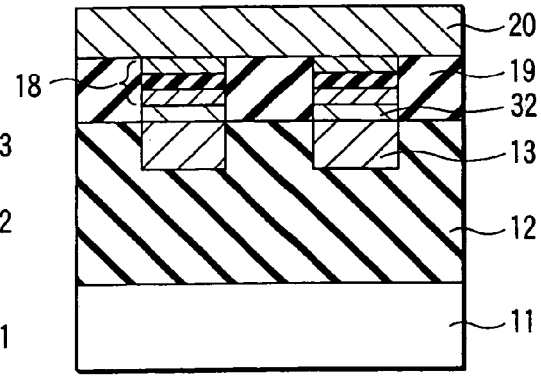
FIG. 25B is a sectional view showing the step in manufacturing the magnetic memory device according to the fifth embodiment of the present invention in the direction in which the second wiring layer runs.

FIGS. 25A and 25B are sectional views showing the steps in manufacturing the magnetic memory device according to the fifth embodiment of the present invention. A magnetic memory device manufacturing method according to the fifth embodiment will be described. A description of the same steps as those of the second embodiment will be omitted.

As shown in FIGS. 11A and 11B to FIGS. 15A and 15B, a magnetic shield layer 21 is so formed as to cover the diode 32, second wiring layer 20, and MTJ element 18.

As shown in FIGS. 25A and 25B, the magnetic shield layer 21 formed on the upper surface of each second wiring layer 20 and the magnetic shield layer 21 formed on a first interlayer dielectric film 12 and first wiring layer 13 between the second wiring layers 20 are removed by vertical anisotropic etching such as RIE. The magnetic shield layer 21a is left on only the side surfaces of the diode 32, the MTJ element 18, a second interlayer dielectric film 19, and the second wiring layer 20.

As shown in FIGS. 24A and 24B, a third interlayer dielectric film 22 is deposited on the magnetic shield layer 21a, second wiring layer 20, first wiring layer 13, and first interlayer dielectric film 12, completing an MRAM memory cell array.

The fifth embodiment can obtain the same effects as those of the second embodiment.

SIXTH EMBODIMENT

The sixth embodiment is a modification of the third embodiment in which a magnetic shield layer is divided every second wiring layer.

Figure 26A:
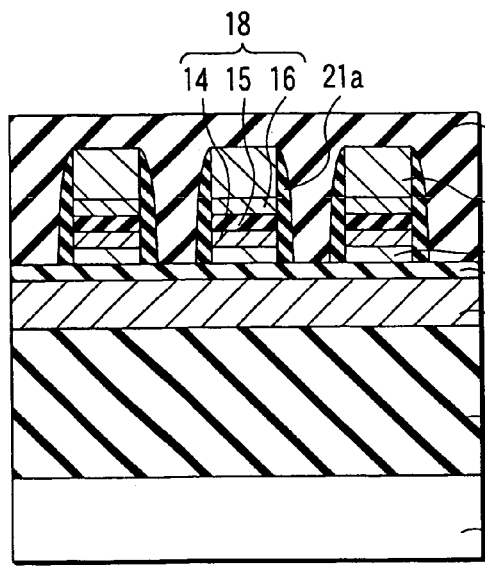
FIG. 26A is a sectional view showing a magnetic memory device according to a sixth embodiment of the present invention in the direction in which the first wiring layer runs.
Figure 26B:
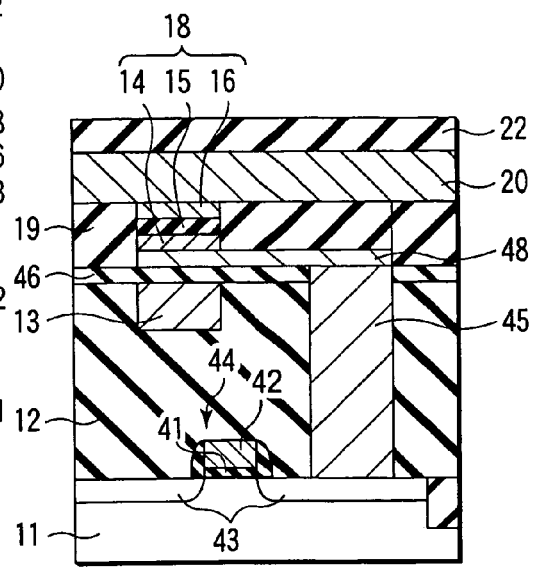
FIG. 26B is a sectional view showing the magnetic memory device according to the sixth embodiment of the present invention in the direction in which the second wiring layer runs.

FIGS. 26A and 26B are sectional views showing a magnetic memory device according to the sixth embodiment of the present invention. FIG. 26A is a sectional view showing the magnetic memory device along a direction in which the first wiring layer runs. FIG. 26B is a sectional view showing the magnetic memory device along a direction in which the second wiring layer runs. The structure of the magnetic memory device according to the sixth embodiment will be explained. Note that only a structure different from that of the third embodiment will be described.

As shown in FIG. 26A and 26B, in the sixth embodiment, a magnetic shield layer 21a is formed on only the side surfaces of each lower electrode 48, each second wiring layer 20, and each MTJ element 18. No magnetic shield layer 21a is formed on each second wiring layer 20 or between adjacent second wiring layers 20. That is, the magnetic shield layer 21a is divided every second wiring layer 20. The magnetic shield layer 21a desirably uses an insulating material in order to prevent short-circuiting between lower and upper magnetic layers 14 and 16 of the MTJ element 18.

The magnetic shield layer 21a suffices to be formed on at least the side surfaces of the second wiring layer 20 and MTJ element 18, and need not always be formed on the side surface of the lower electrode 48.

Figure 27A:
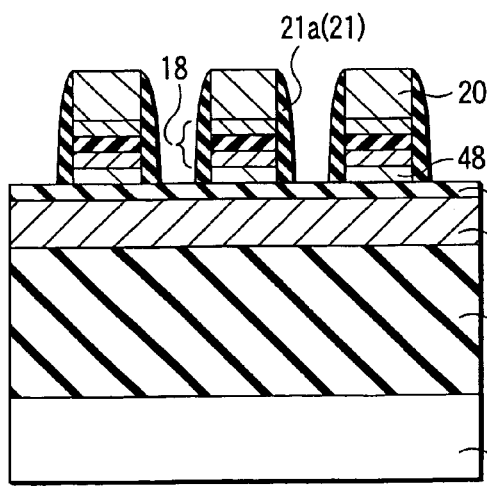
FIG. 27A is a sectional view showing the step in manufacturing the magnetic memory device according to the sixth embodiment of the present invention in the direction in which the first wiring layer runs.
Figure 27B:
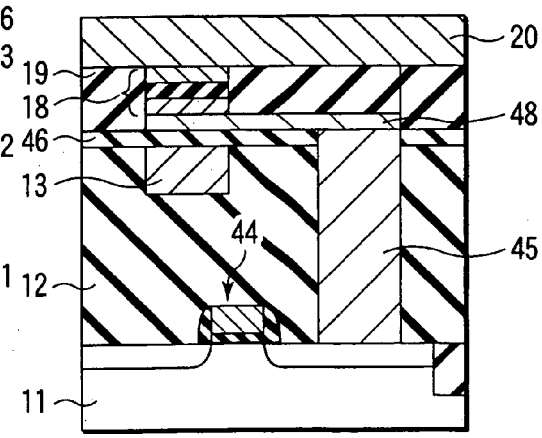
FIG. 27B is a sectional view showing the step in manufacturing the magnetic memory device according to the sixth embodiment of the present invention in the direction in which the second wiring layer runs.

FIGS. 27A and 27B are sectional views showing the steps in manufacturing the magnetic memory device according to the sixth embodiment of the present invention. A magnetic memory device manufacturing method according to the sixth embodiment will be described. A description of the same steps as those of the third embodiment will be omitted.

As shown in FIGS. 17A and 17B to FIGS. 21A and 21B, a magnetic shield layer 21 is so formed as to cover the lower electrode 48, second wiring layer 20, and MTJ element 18.

As shown in FIGS. 27A and 27B, the magnetic shield layer 21 formed on the upper surface of each second wiring layer 20 and the magnetic shield layer 21 formed on a first interlayer dielectric film 12 and first wiring layer 13 between the second wiring layers 20 are removed by vertical anisotropic etching such as RIE. The magnetic shield layer 21a is left on only the side surfaces of the lower electrode 48, the MTJ element 18, a second interlayer dielectric film 19, and the second wiring layer 20.

As shown in FIGS. 26A and 26B, a third interlayer dielectric film 22 is deposited on the magnetic shield layer 21a, second wiring layer 20, first wiring-layer 13, and first interlayer dielectric film 12, completing an MRAM memory cell array.

The sixth embodiment can obtain the same effects as those of the third embodiment.

SEVENTH EMBODIMENT

The seventh embodiment is another modification of the first embodiment in which a magnetic shield layer is divided every second wiring layer, similar to the fourth embodiment, and the magnetic shield layer is also formed on the second wiring layer.

Figure 28:
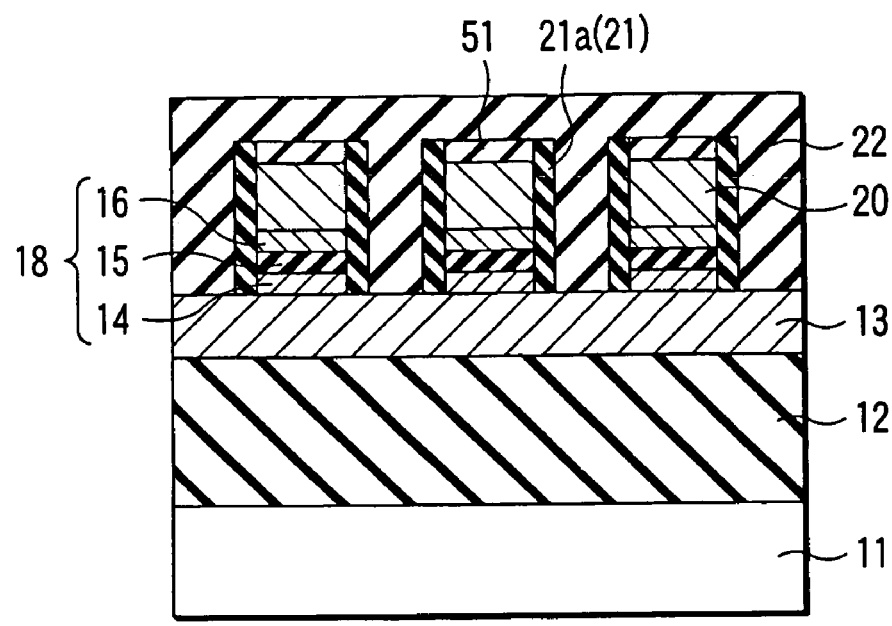
FIG. 28 is a sectional view showing a magnetic memory device according to a seventh embodiment of the present invention.

FIG. 28 is a sectional view showing a magnetic memory device according to the seventh embodiment of the present invention. The structure of the magnetic memory device according to the seventh embodiment will be explained. Note that only a structure different from that of the first embodiment will be described.

As shown in FIG. 28, the magnetic memory device according to the seventh embodiment comprises a first magnetic shield layer 21a formed on the side surfaces of each second wiring layer 20 and each MTJ element 18, and a second magnetic shield layer 51 formed on the second wiring layer 20. The magnetic shield layer 21a is not formed between adjacent second wiring layers 20, and is divided every second wiring layer 20, similar to the fourth embodiment. The first magnetic shield layer 21a desirably uses an insulating material in order to prevent short-circuiting between lower and upper magnetic layers 14 and 16 of the MTJ element 18. The second magnetic shield layer 51 is not limited to an insulating material, and can adopt a conductive material.

In the use of a conductive magnetic layer for the second magnetic shield layer 51, examples of the material of the conductive magnetic layer are an Ni—Fe alloy, Co—Fe alloy, Co—Fe—Ni alloy, Co—(Zr, Hf, Nb, Ta, Ti)-based amorphous material, and (Co, Fe, Ni)—(Si, B)—(P, Al, Mo, Nb, Mn)-based amorphous material.

Figure 29:
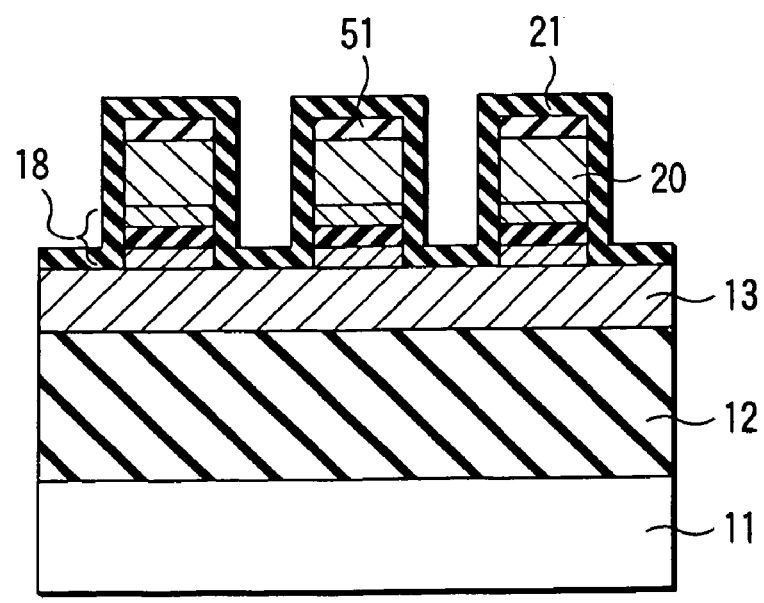
FIG. 29 is a sectional view showing the step in manufacturing the magnetic memory device according to the seventh embodiment of the present invention.

FIG. 29 is a sectional view showing the step in manufacturing the magnetic memory device according to the seventh embodiment of the present invention. A magnetic memory device manufacturing method according to the seventh embodiment will be described. A description of the same steps as those of the first embodiment will be omitted.

As shown in FIGS. 2A, 2B, 2C to FIGS. 8A, 8B, and 8C, a second interlayer dielectric film 19 exposed between the second wiring layers 20 is removed using the second wiring layers 20 as a mask until a first interlayer dielectric film 12 and first wiring layer 13 are exposed.

As shown in FIG. 29, a magnetic shield layer 51 is formed on each second wiring layer 20. A magnetic shield layer 21 is so formed as to cover the magnetic shield layer 51, second wiring layer 20, and MTJ element 18.

As shown in FIG. 28, the magnetic shield layer 21 formed on the upper surface of each second wiring layer 20 and the magnetic shield layer 21 formed on the first interlayer dielectric film 12 and first wiring layer 13 between the second wiring layers 20 are removed by vertical anisotropic etching such as RIE. The magnetic shield layer 21a is left on the side surfaces of the MTJ element 18, second interlayer dielectric film 19, and second wiring layer 20. The magnetic shield layer 51 is left on the second wiring layer 20. Thereafter, a third interlayer dielectric film 22 is deposited on the magnetic shield layer 51, first wiring layer 13, and first interlayer dielectric film 12, completing an MRAM memory cell array.

The seventh embodiment can obtain the same effects as those of the first embodiment.

Similar to the fourth embodiment, the magnetic shield layers 21a and 51 are divided every adjacent second wiring layer 20. The material of the magnetic shield layer 51 is not limited to an insulating material, and can be a conductive material. This can improve the material selectivity of the magnetic shield layer 51.

In the seventh embodiment, the magnetic shield layer 51 is formed on the second wiring layer 20. This embodiment can enhance the effects of suppressing erroneous write and concentrating a magnetic field on a selected cell, compared to the fourth embodiment.

Figure 30A:
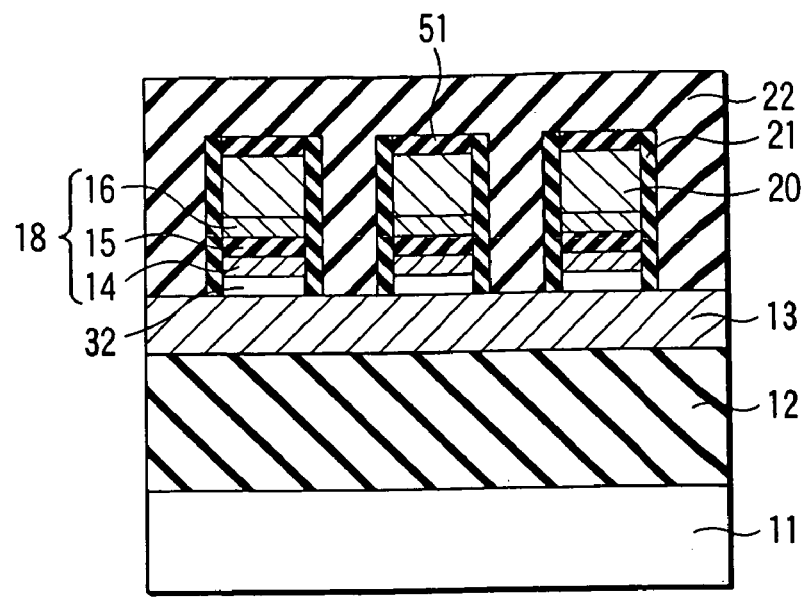
FIGS. 30A and 30B are sectional views showing a magnetic memory device having a diode as a switching element according to the seventh embodiment of the present invention.
Figure 30B:
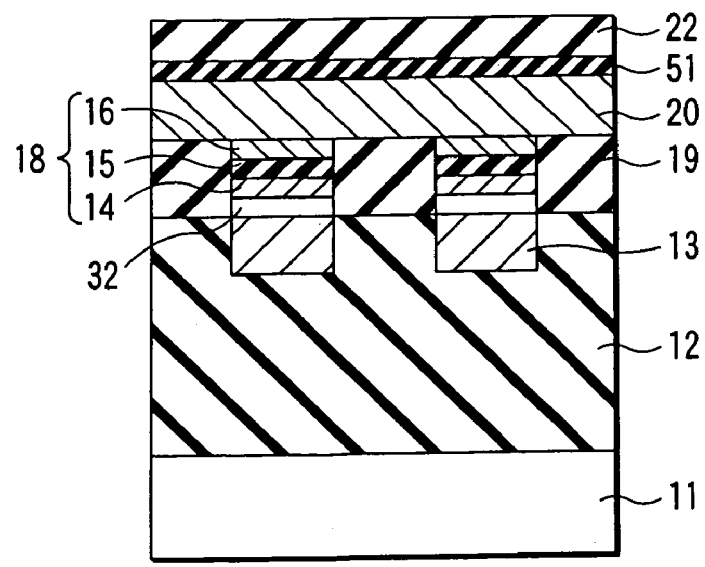
Figure 31A:
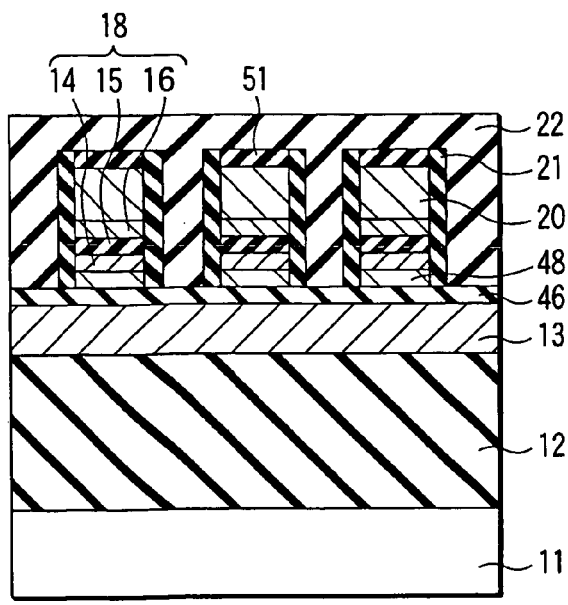
FIGS. 31A and 31B are sectional views showing a magnetic memory device having a MOSFET as a switching element according to the seventh embodiment of the present invention.
Figure 31B:
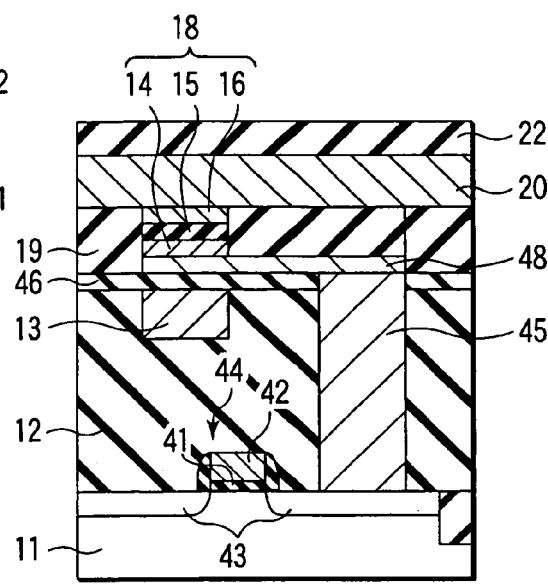

The seventh embodiment is applied to the structure of the first embodiment, but is not limited to this. The seventh embodiment can also be applied to a magnetic memory device having a diode 32 as a switching element, as shown in FIGS. 30A and 30B, similar to the second embodiment. The seventh embodiment can also be applied to a magnetic memory device having a MOSFET 44 as a switching element, as shown in FIGS. 31A and 31B, similar to the third embodiment.

EIGHTH EMBODIMENT

The eighth embodiment is still another modification of the first embodiment in which the side surfaces of each second wiring layer and each MTJ element are covered with an insulating layer and a magnetic shield layer is formed over adjacent second wiring layers.

Figure 32:
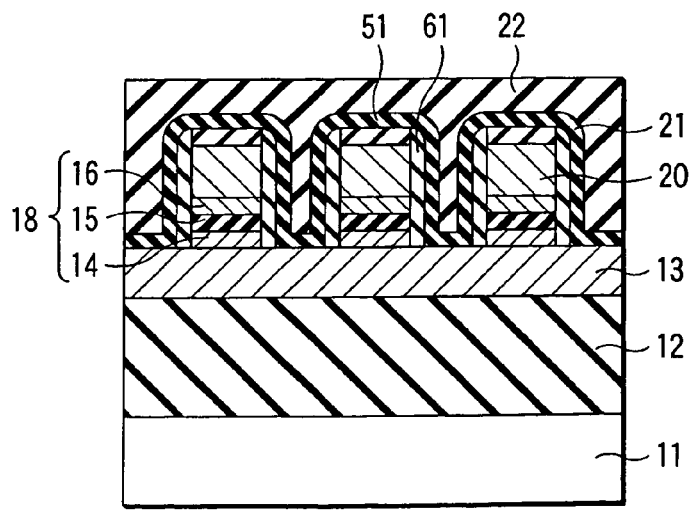
FIG. 32 is a sectional view showing a magnetic memory device according to an eighth embodiment of the present invention.

FIG. 32 is a sectional view showing a magnetic memory device according to the eighth embodiment of the present invention. The structure of the magnetic memory device according to the eighth embodiment will be explained. Note that only a structure different from that of the first embodiment will be described.

As shown in FIG. 32, in the magnetic memory device according to the eighth embodiment, a side wall insulating layer 61 is formed on the side surfaces of each second wiring layer 20 and each MTJ element 18. A magnetic shield layer 51 is formed on the second wiring layer 20. A magnetic shield layer 21 is so formed as to cover the side wall insulating layer 61 and magnetic shield layer 51. The eighth embodiment uses the side wall insulating layer 61 to electrically isolate adjacent second wiring layers 20 and adjacent MTJ elements 18. Thus, the magnetic shield layer 21 is continuously formed over adjacent second wiring layers 20.

When the magnetic shield layer 51 uses, e.g., an insulating material, the magnetic shield layer 21 is not limited to an insulating material and can use a conductive material. On the other hand, when the magnetic shield layer 51 uses, e.g., a conductive material, the magnetic shield layer 21 desirably uses an insulating material in order to prevent short-circuiting between adjacent second wiring layers 20.

The magnetic shield layer 51 need not always be formed on the second wiring layer 20, and the magnetic shield layer 21 may be directly formed on the second wiring layer 20.

Figure 33:
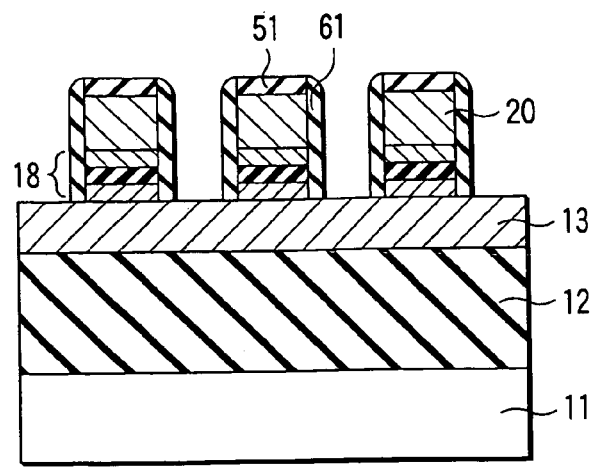
FIG. 33 is a sectional view showing the step in manufacturing the magnetic memory device according to the eighth embodiment of the present invention.

FIG. 33 is a sectional view showing the step in manufacturing the magnetic memory device according to the eighth embodiment of the present invention. A magnetic memory device manufacturing method according to the eighth embodiment will be described. A description of the same steps as those of the first embodiment will be omitted.

As shown in FIGS. 2A, 2B, 2C to FIGS. 8A, 8B, and 8C, a second interlayer dielectric film 19 exposed between the second wiring layers 20 is removed using the second wiring layers 20 as a mask until a first interlayer dielectric film 12 and first wiring layer 13 are exposed.

As shown in FIG. 33, a magnetic shield layer 51 is formed on each second wiring layer 20. A side wall insulating layer 61 is formed on the side surfaces of the second interlayer dielectric film 19 (not shown), second wiring layer 20, and MTJ element 18.

As shown in FIG. 32, a magnetic shield layer 21 is so formed as to cover the magnetic shield layer 51 and side wall insulating layer 61. A third interlayer dielectric film 22 is deposited on the magnetic shield layer 21, completing an MRAM memory cell array.

The eighth embodiment can obtain the same effects as those of the first embodiment.

In the eighth embodiment, the side wall insulating layer 61 covers the side surfaces of the second wiring layer 20 and MTJ element 18. Even when the magnetic shield layer 21 is continuously formed over adjacent second wiring layers 20, the material of the magnetic shield layer 21 is not limited to an insulating material, and can be a conductive material. This can improve the material selectivity of the magnetic shield layer 21.

Figure 34A:
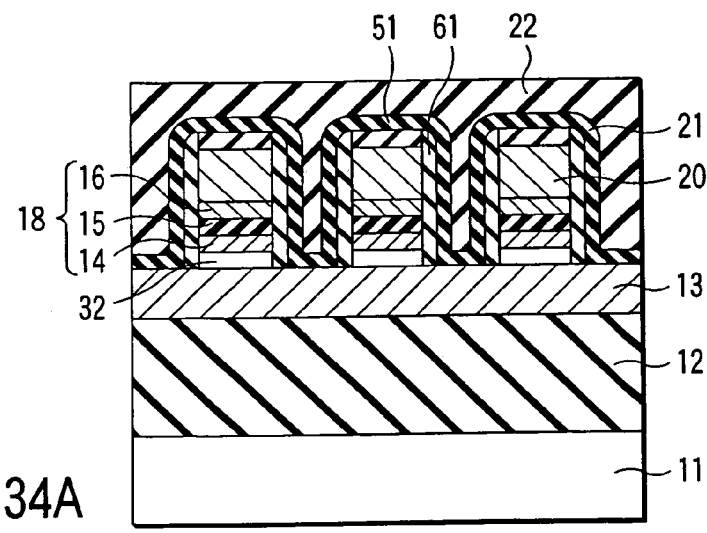
FIGS. 34A and 34B are sectional views showing a magnetic memory device having a diode as a switching element according to the eighth embodiment of the present invention.
Figure 34B:
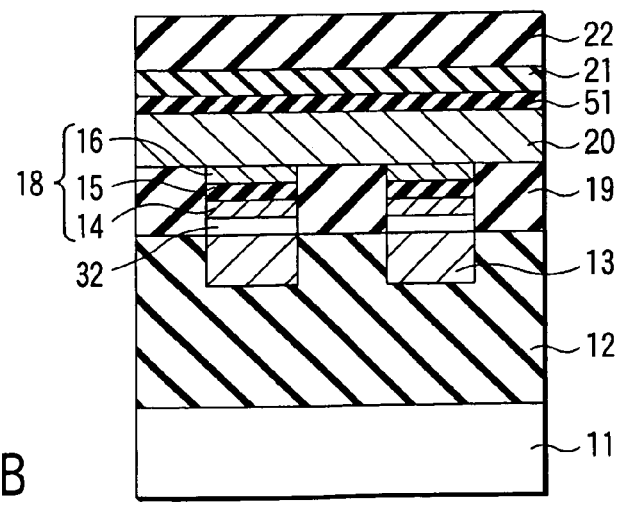
Figure 35A:
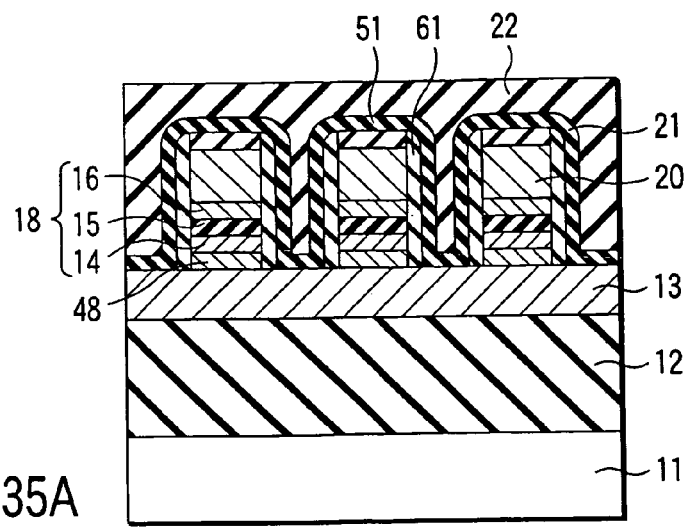
FIGS. 35A and 35B are sectional views showing a magnetic memory device having a MOSFET as a switching element according to the eighth embodiment of the present invention.
Figure 35B:
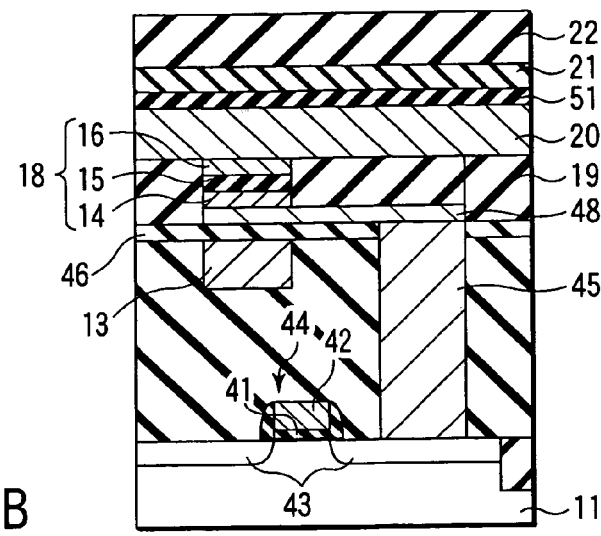
Figure 36:
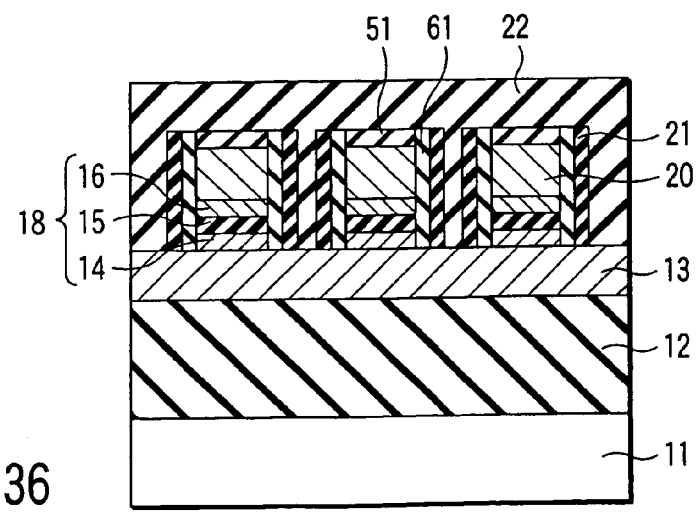
FIG. 36 is a sectional view showing another magnetic memory device according to the eighth embodiment of the present invention in which a magnetic shield layer is divided every second wiring layer.
Figure 37A:
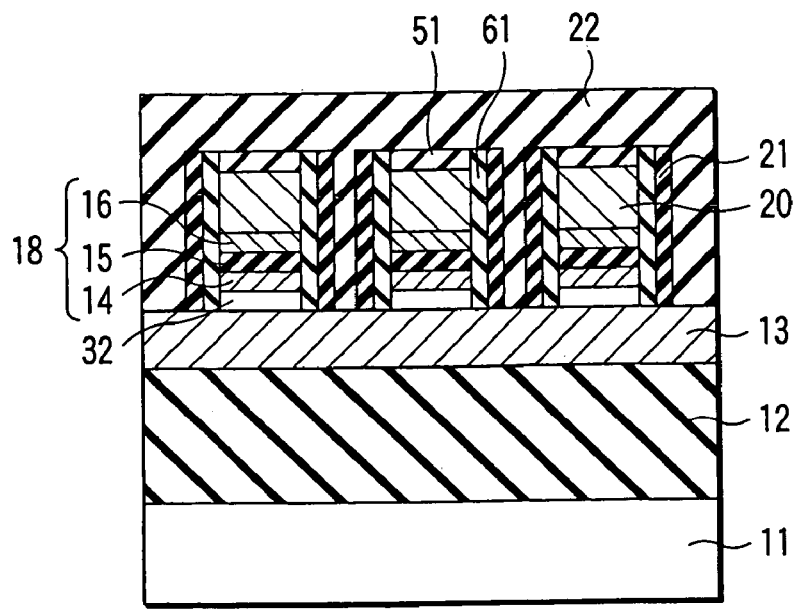
FIGS. 37A and 37B are sectional views showing another magnetic memory device having a diode as a switching element according to the eighth embodiment of the present invention in which a magnetic shield layer is divided every second wiring layer.
Figure 37B:
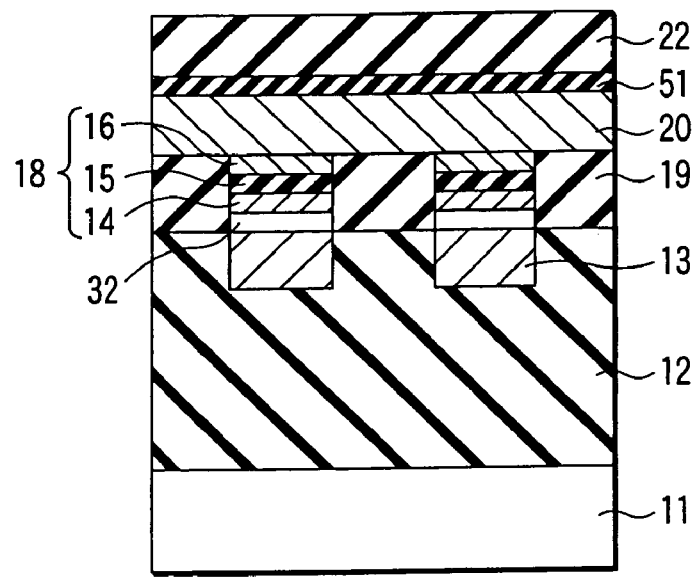
Figure 38A:
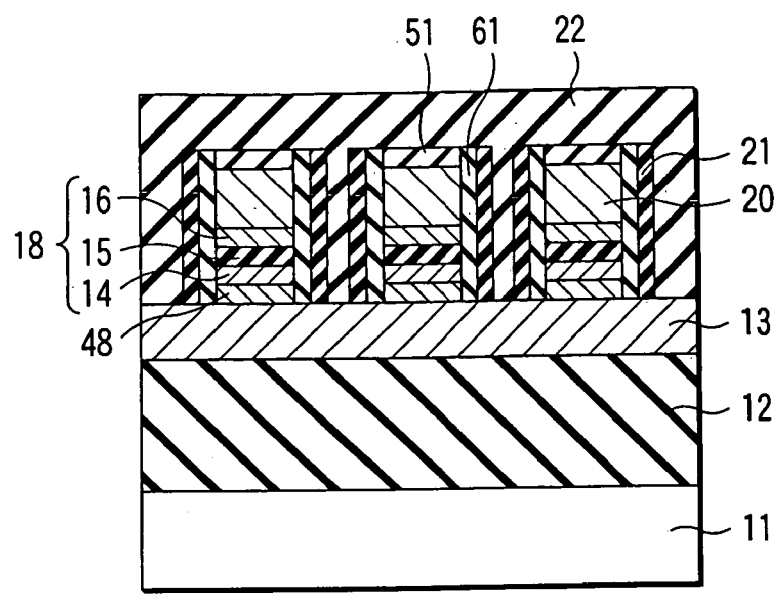
FIGS. 38A and 38B are sectional views showing another magnetic memory device having a MOSFET as a switching element according to the eighth embodiment of the present invention in which a magnetic shield layer is divided every second wiring layer.
Figure 38B:
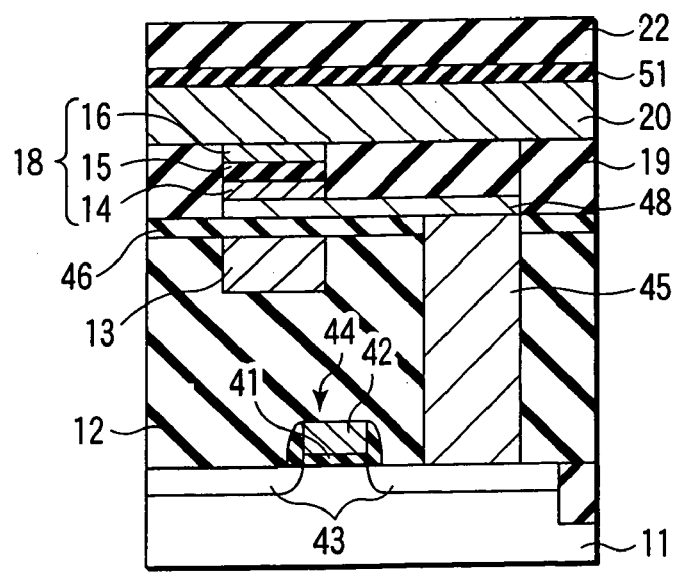

The eighth embodiment is applied to the structure of the first embodiment, but is not limited to this. The eighth embodiment can also be applied to a magnetic memory device having a diode 32 as a switching element, as shown in FIGS. 34A and 34B, similar to the second embodiment. The eighth embodiment can also be applied to a magnetic memory device having a MOSFET 44 as a switching element, as shown in FIGS. 35A and 35B, similar to the third embodiment.

In FIGS. 30, 34A, 34B, 35A, and 35B, the magnetic shield layer 21 is continuously formed over adjacent second wiring layers 20, but is not limited to this. For example, as shown in FIGS. 36, 37A, 37B, 38A, and 38B, the magnetic shield layer 21 may be divided every second wiring layer 20 by removing the magnetic shield layer 21 from between adjacent second wiring layers 20 and from the magnetic shield layer 51. In this case, the magnetic shield layers 21 and 51 can adopt either an insulating or conductive material.

NINTH EMBODIMENT

The ninth embodiment is still another modification of the first embodiment in which the side surface of each MTJ element is covered with an insulating layer and a magnetic shield layer is formed over adjacent second wiring layers.

FIG. 39 is a sectional view showing a magnetic memory device according to the ninth embodiment of the present invention. The structure of the magnetic memory device according to the ninth embodiment will be explained. Note that only a structure different from that of the first embodiment will be described.

As shown in FIG. 39, in the magnetic memory device according to the ninth embodiment, the width of each second wiring layer 20 is larger than that of each MTJ element 18. A side wall insulating layer 19a is formed on the side surface of the MTJ element 18 recessed from the side surface of the second wiring layer 20. A magnetic shield layer 21 is so formed as to cover the side wall insulating layer 19a and second wiring layer 20. The magnetic shield layer 21 is continuously formed over adjacent second wiring layers 20.

In the ninth embodiment, when the magnetic shield layer 21 made of a conductive material is formed over adjacent second wiring layers 20, MTJ elements 18 adjacent to each other in a direction in which a first wiring layer 13 runs are electrically isolated by the side wall insulating layer 19a.

However, adjacent second wiring layers 20 are not electrically isolated. From this, the magnetic shield layer 21 desirably uses an insulating material in the ninth embodiment.

FIG. 40 is a sectional view showing the step in manufacturing the magnetic memory device according to the ninth embodiment of the present invention. A magnetic memory device manufacturing method according to the ninth embodiment will be described. A description of the same steps as those of the first embodiment will be omitted.

As shown in FIGS. 2A, 2B, 2C to FIGS. 6A, 6B, and 6C, island-like MTJ elements 18 isolated in every cell are formed. A second interlayer dielectric film 19 is formed on the MTJ elements 18 and first wiring layer 13. The second interlayer dielectric film 19 is planarized using CMP or etch-back until the surface of each MTJ element 18 is exposed.

As shown in FIG. 40, second wiring layers 20 are formed on the MTJ elements 18 and second interlayer dielectric film 19 perpendicularly to a direction in which the first wiring layer 13 runs. At this time, each second wiring layer 20 is formed larger in width than the MTJ element 18.

As shown in FIG. 39, the second interlayer dielectric film 19 exposed between the second wiring layers 20 is removed using the second wiring layers 20 as a mask until a first interlayer dielectric film 12 and the first wiring layer 13 are exposed. As a result, a side wall insulating layer 19a is formed from the second interlayer dielectric film 19 on the side surface of the MTJ element 18. A magnetic shield layer 21 is formed on the second wiring layers 20, first interlayer dielectric film 12, and first wiring layer 13. A third interlayer dielectric film 22 is deposited on the magnetic shield layer 21, completing an MRAM memory cell array.

The ninth embodiment can obtain the same effects as those of the first embodiment.

Figure 41A:
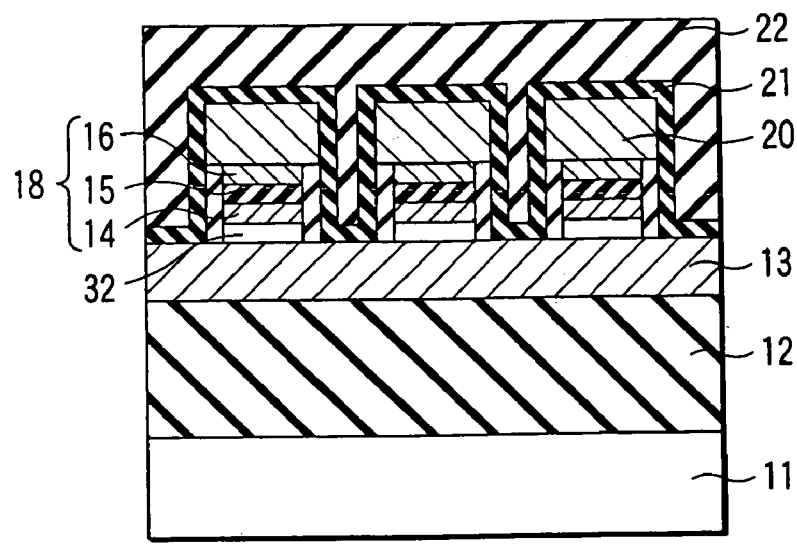
FIGS. 41A and 41B are sectional views showing a magnetic memory device having a diode as a switching element according to the ninth embodiment of the present invention.
Figure 41B:
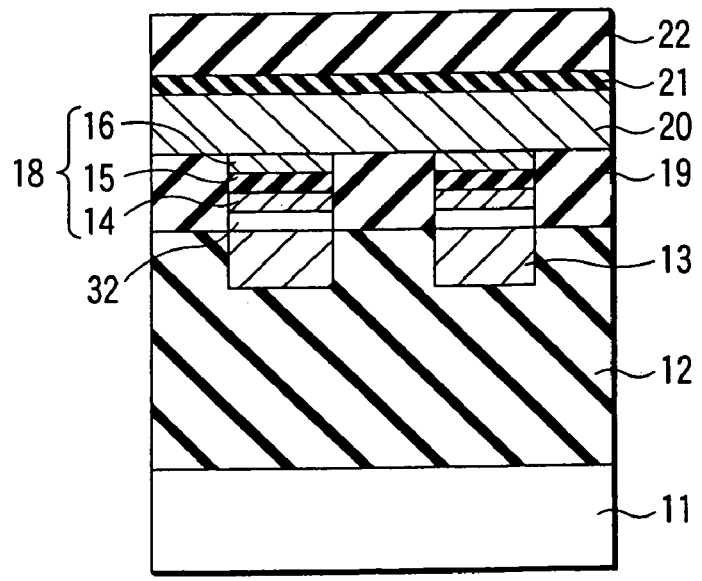
Figure 42A:
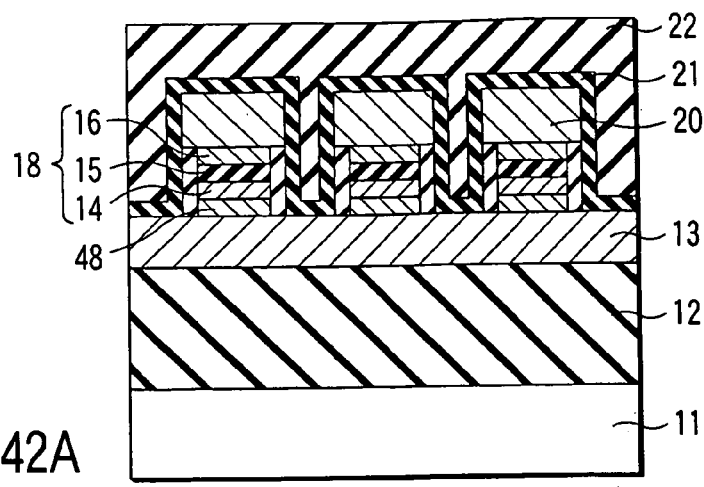
FIGS. 42A and 42B are sectional views showing a magnetic memory device having a MOSFET as a switching element according to the ninth embodiment of the present invention.
Figure 42B:
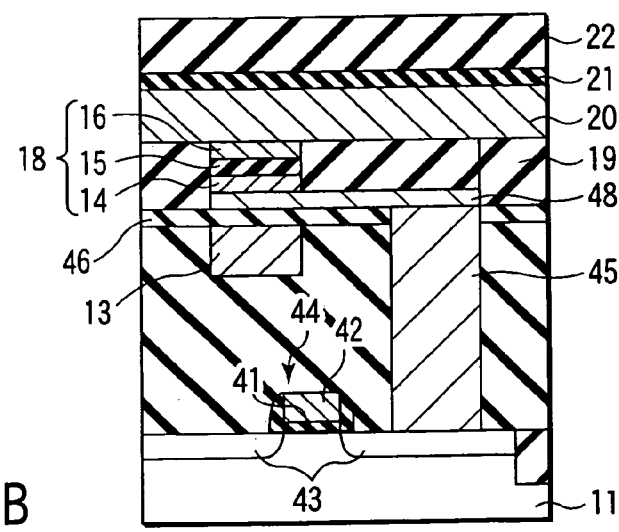
Figure 43:
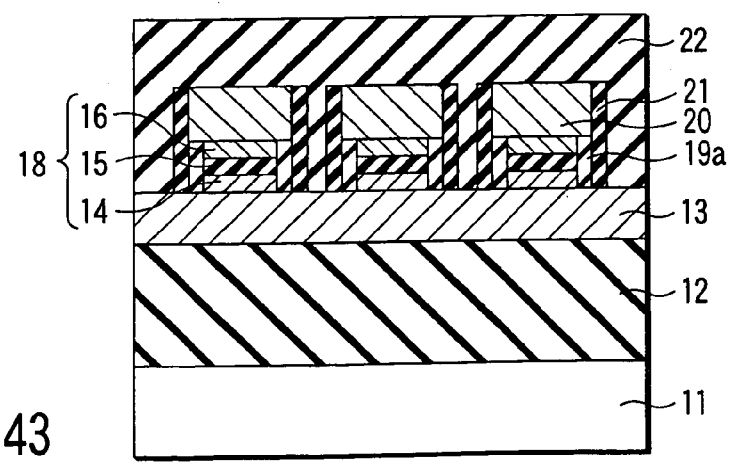
FIG. 43 is a sectional view showing another magnetic memory device according to the ninth embodiment of the present invention in which a magnetic shield layer is divided every second wiring layer.
Figure 44A:
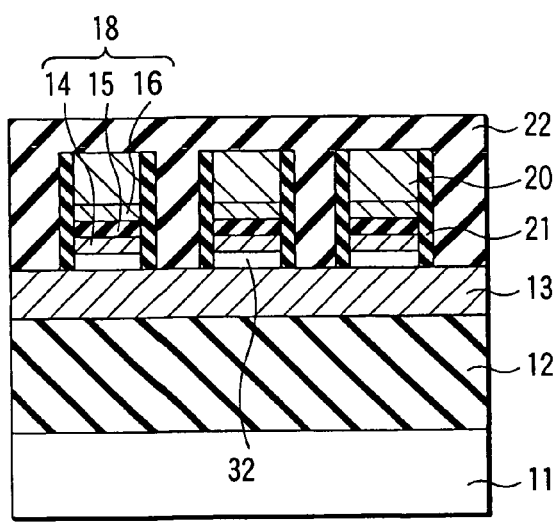
FIGS. 44A and 44B are sectional views showing another magnetic memory device having a diode as a switching element according to the ninth embodiment of the present invention in which a magnetic shield layer is divided every second wiring layer.
Figure 44B:
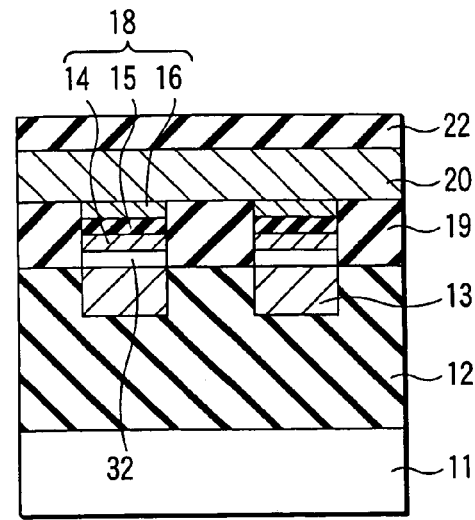
Figure 45A:
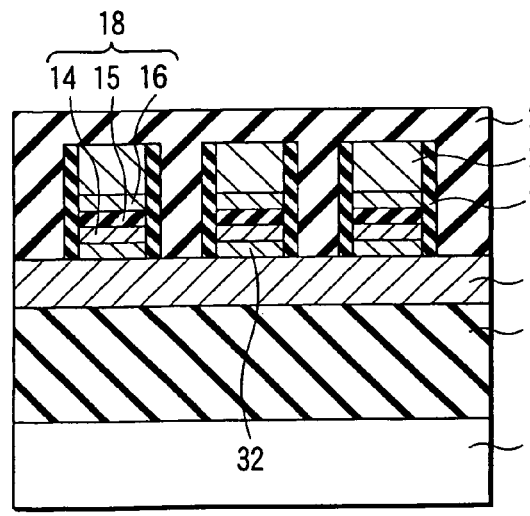
FIGS. 45A and 45B are sectional views showing another magnetic memory device having a MOSFET as a switching element according to the ninth embodiment of the present invention in which a magnetic shield layer is divided every second wiring layer.
Figure 45B:
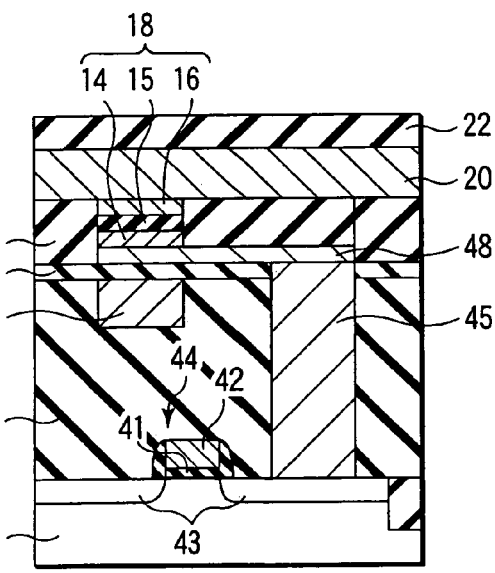
Figure 48A:
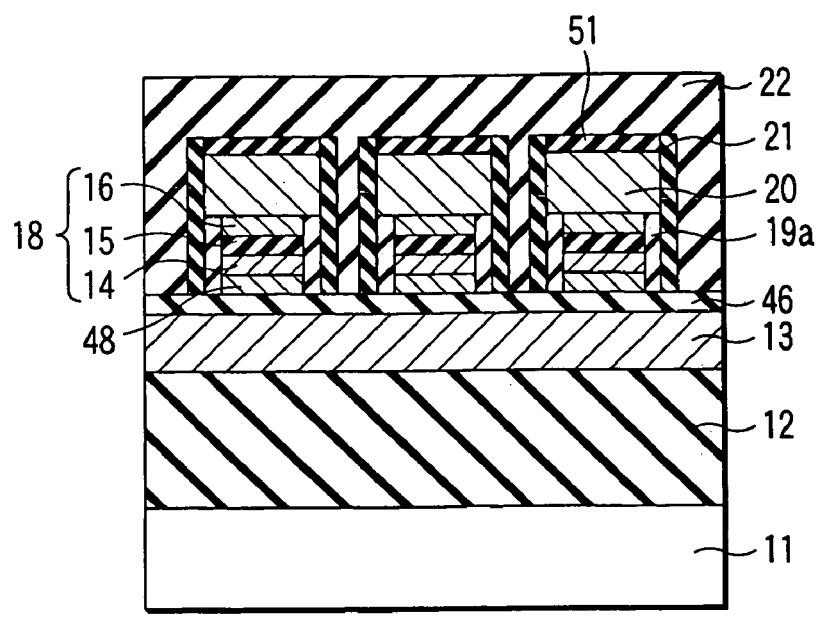
FIGS. 48A and 48B are sectional views showing still another magnetic memory device having a MOSFET as a switching element according to the ninth embodiment of the present invention in which the magnetic shield layer is divided every second wiring layer and formed on the second wiring layer.
Figure 48B:
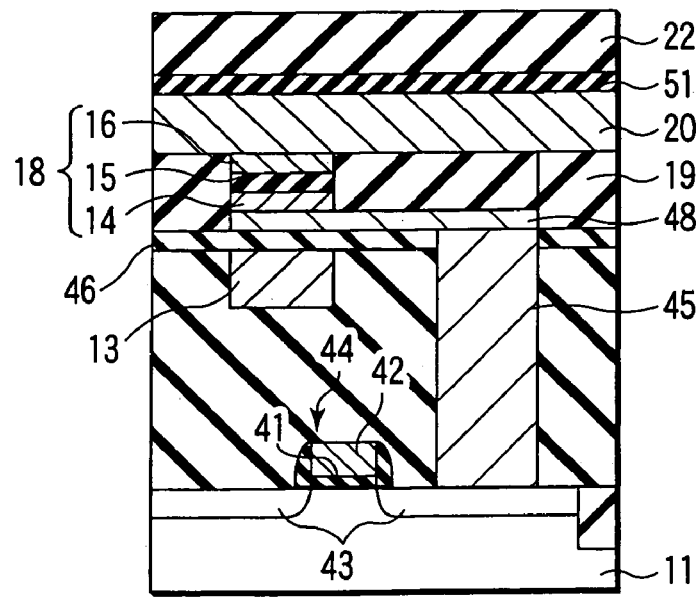

The ninth embodiment is applied to the structure of the first embodiment, but is not limited to this. The ninth embodiment can also be applied to a magnetic memory device having a diode 32 as a switching element, as shown in FIGS. 41A and 41B, similar to the second embodiment. The ninth embodiment can also be applied to a magnetic memory device having a MOSFET 44 as a switching element, as shown in FIGS. 42A and 42B, similar to the third embodiment.

In FIGS. 39, 41A, 41B, 42A, and 42B, the magnetic shield layer 21 is continuously formed over adjacent second wiring layers 20, but is not limited to this. For example, as shown in FIGS. 43, 44A, 44B, 45A, and 45B, the magnetic shield layer 21 may be divided every second wiring layer 20 by removing the magnetic shield layer 21 from between adjacent second wiring layers 20 and from a magnetic shield layer 51. In this case, the magnetic shield layer 21 can adopt either an insulating or conductive material.

In FIGS. 43, 44A, 44B, 45A, and 45B, the magnetic shield layer 21 is not left on the second wiring layer 20, but is not limited to this. For example, as shown in FIGS. 46, 47A, 47B, 48A, and 48B, the magnetic shield layer 51 may be formed on the second wiring layer 20. In this case, the magnetic shield layers 21 and 51 can use either an insulating or conductive material. These structures can further enhance the effects of suppressing erroneous write and concentrating a magnetic field on a selected cell.

TENTH EMBODIMENT

The tenth embodiment provides the same structure as that of the first embodiment except an MTJ element patterning method.

FIGS. 49 to 52 are perspective views showing the steps in manufacturing a magnetic memory device according to the tenth embodiment of the present invention. A magnetic memory device manufacturing method according to the tenth embodiment will be described. The same steps as those of the first embodiment will be explained briefly.

As shown in FIG. 49, a first interlayer dielectric film 12 and first wiring layer 13 are formed on a semiconductor substrate 11, similar to the first embodiment. A TMR material layer 17 made up of a magnetically fixed layer 14, tunnel junction layer 15, and magnetic recording layer 16 is formed on the first interlayer dielectric film 12 and first wiring layer 13. The TMR material layer 17 is selectively etched using a mask (not shown) to form a straight TMR material layer 17 running in a direction in which the first wiring layer 13 runs. A second interlayer dielectric film 19 is formed on the TMR material layer 17 and first interlayer dielectric film 12. The second interlayer dielectric film 19 is planarized using CMP or etch-back until the surface of the TMR material layer 17 is exposed.

As shown in FIG. 50, second wiring layers 20 are formed on the TMR material layer 17 and second interlayer dielectric film 19 perpendicularly to the direction in which the first wiring layer 13 runs.

Figure 51:
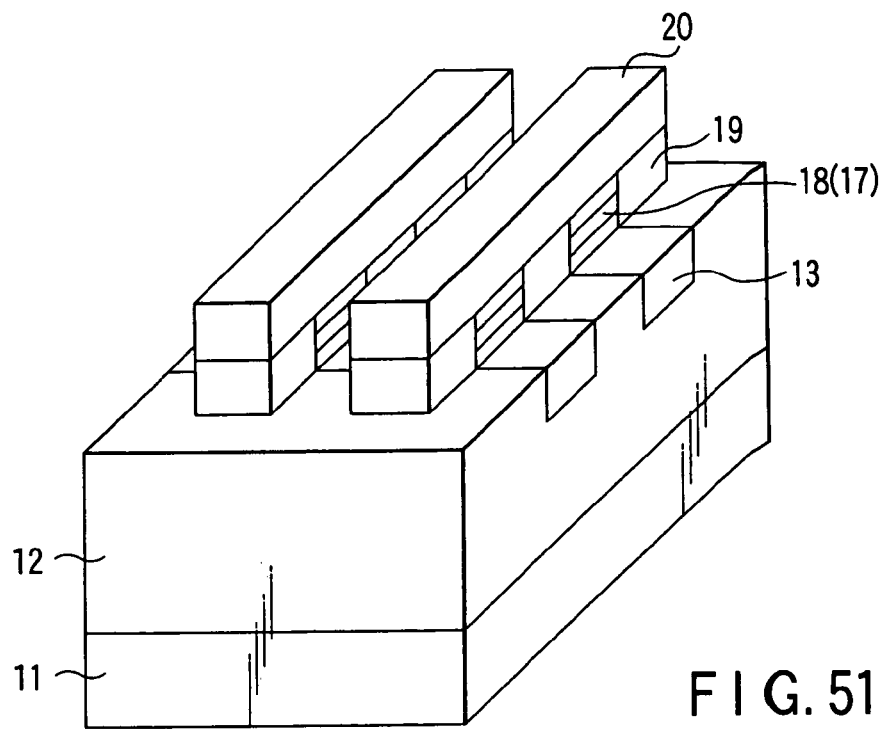

As shown in FIG. 51, the second interlayer dielectric film 19 and TMR material layer 17 exposed between the second wiring layers 20 are removed using the second wiring layers 20 as a mask until the first interlayer dielectric film 12 and first wiring layer 13 are exposed. As a result, island-like MTJ elements 18 isolated in every cell are formed.

Figure 52:
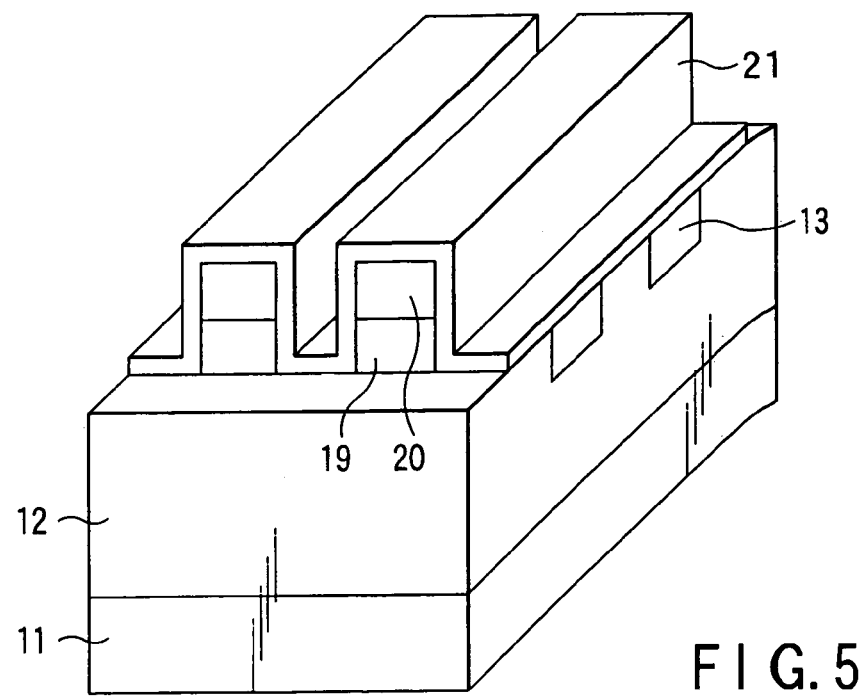

As shown in FIG. 52, a magnetic shield layer. 21 is formed on the second wiring layers 20, first interlayer dielectric film 12, and first wiring layer 13.

Similar to the first embodiment, as shown in FIGS. 1A, 1B, and 1C, a third interlayer dielectric film 22 is deposited on the magnetic shield layer 21, completing an MRAM memory cell array.

The tenth embodiment can obtain the same effects as those of the first embodiment.

In the tenth embodiment, the MTJ element 18 is first patterned into a straight shape and then processed in self-alignment with the second wiring layer 20. This method can form, e.g., a rectangular MTJ element 18 which cannot originally be implemented by only lithography. By decreasing, e.g., the magnetization switching threshold, a current amount necessary for write can be reduced. Variations in shape between the MTJ elements 18 can be suppressed, and variations in write current threshold between the MTJ elements 18 can be suppressed. A memory in which the power consumption of all memory cells is suppressed and a write error hardly occurs can be formed.

In the above description, the manufacturing method according to the tenth embodiment is applied to the first embodiment. However, this method can also be applied to the second to eighth embodiments as far as the second wiring layer and MTJ element have the same width.

ELEVENTH EMBODIMENT

The eleventh embodiment relates to modifications of the first to third embodiments in which not only the second wiring layer but also the first wiring layer are covered with a magnetic shield layer.

Figure 53A:
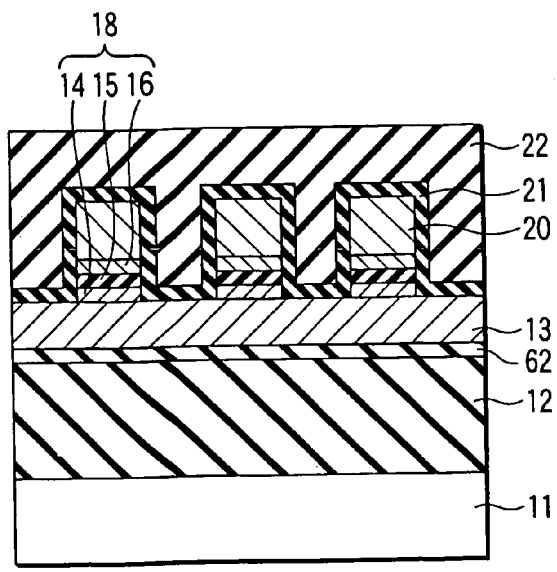
FIGS. 53A and 53B are sectional views showing a magnetic memory device without any switching element according to an eleventh embodiment of the present invention.
Figure 53B:
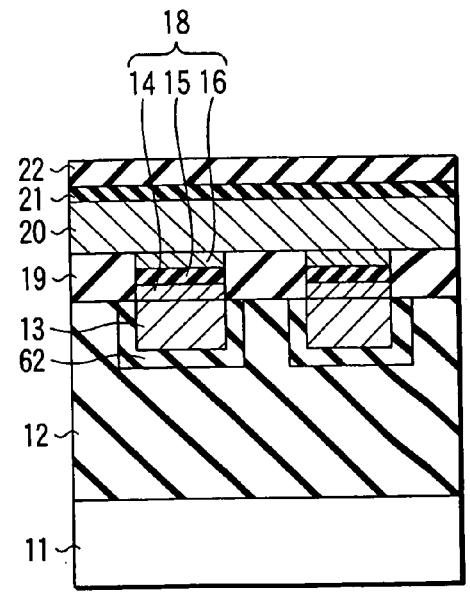
Figure 54A:
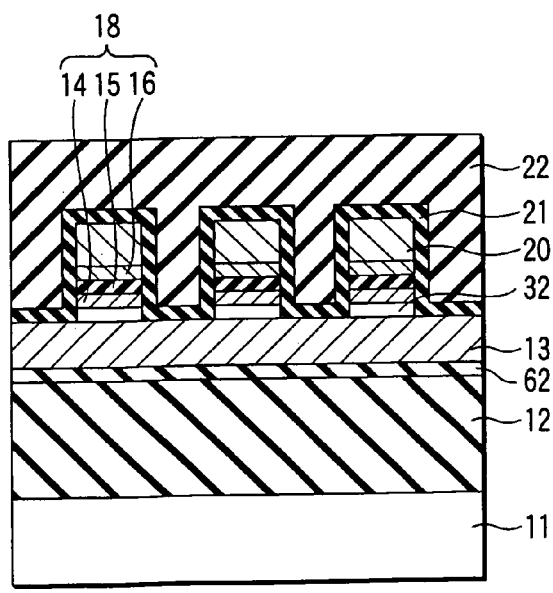
FIGS. 54A and 54B are sectional views showing a magnetic memory device having a diode as a switching element according to the eleventh embodiment of the present invention.
Figure 54B:
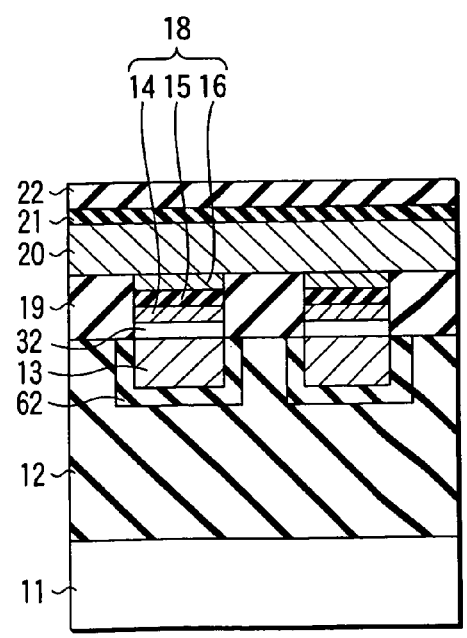
Figure 55A:
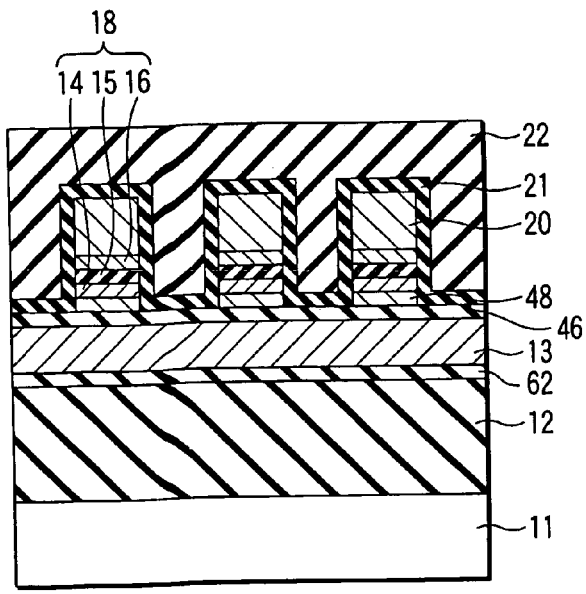
FIGS. 55A and 55B are sectional views showing a magnetic memory device having a MOSFET as a switching element according to the eleventh embodiment of the present invention.
Figure 55B:
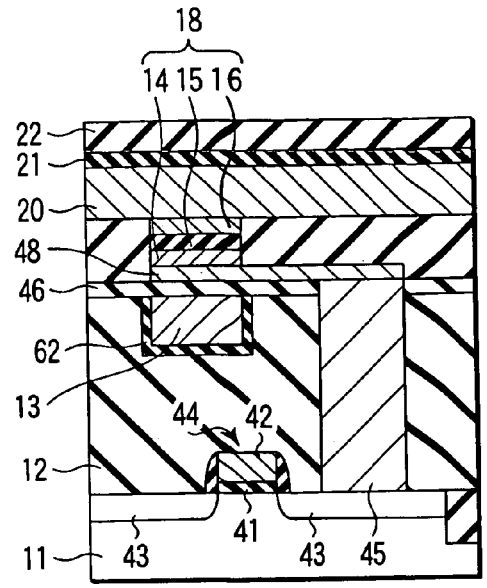

FIGS. 53A, 53B, 54A, 54B, 55A, and 55B are sectional views showing a magnetic memory device according to the eleventh embodiment of the present invention. FIGS. 53A and 53B show still another modification of the first embodiment in which no switching element is arranged. FIGS. 54A and 54B show a modification of the second embodiment in which a diode 32 is arranged as a switching element. FIGS. 55A and 55B show a modification of the third embodiment in which a transistor 44 is arranged as a switching element. The structure of the magnetic memory device according to the eleventh embodiment will be described. Note that only a structure different from that of the first embodiment will be explained.

As shown in FIGS. 53A, 53B, 54A, 54B, 55A, and 55B, in the magnetic memory device according to the eleventh embodiment, a magnetic shield layer 62 is formed on the bottom and side surfaces of a first wiring layer 13. The magnetic shield layer 62 is divided every cell, and may be formed from either an insulating or conductive material.

When the first wiring layer 13 has a damascene structure, the magnetic shield layer 62 is formed by, e.g., the following method. A first wiring groove is formed in an insulating film 12. A magnetic shield layer 62 is formed in the groove, and a first wiring material layer is formed on the magnetic shield layer 62. The magnetic shield layer 62 and material layer are planarized by CMP or etch-back until the surface of the insulating film 12 is exposed. Accordingly, a structure in which the magnetic shield layer 62 is formed on the bottom and side surfaces of the-first wiring layer 13 is obtained.

The eleventh embodiment can obtain the same effects as those of the first embodiment.

In the eleventh embodiment, the bottom and side surfaces of the first wiring layer 13 are covered with the magnetic shield layer 62. The magnetic shield layer 62 exhibits a yoke effect and allows efficient application of a current magnetic field generated by the first wiring layer 13 to a selected cell. The write current supplied to the first wiring layer 13 can be reduced, and the power consumption can be further reduced.

By covering the first wiring layer 13 with the magnetic shield layer 62, a magnetic field that leaks to adjacent MTJ elements 18 arranged in a direction in which a second wiring layer 20 runs can be efficiently shielded to suppress erroneous write.

The magnetic shield layer 62 is divided every adjacent first wiring layer 13. The material of the magnetic shield layer 62 is not limited to an insulating material, and can be a conductive material. This can improve the material selectivity of the magnetic shield layer 62.

TWELFTH EMBODIMENT

The twelfth embodiment is a modification of the eleventh embodiment in which a magnetic shield layer is sandwiched between barrier metal layers.

Figure 56A:
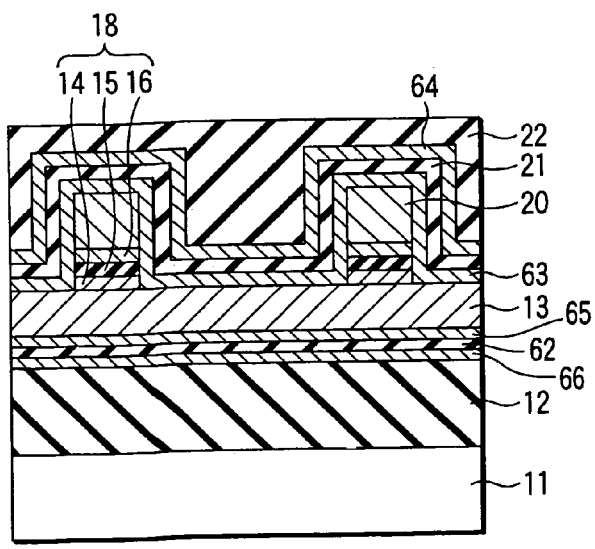
FIGS. 56A and 56B are sectional views showing a magnetic memory device without any switching element according to the twelfth embodiment of the present invention.
Figure 56B:
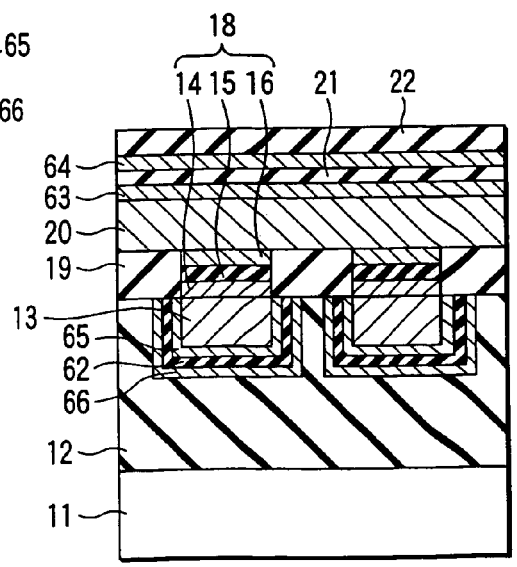
Figure 57A:
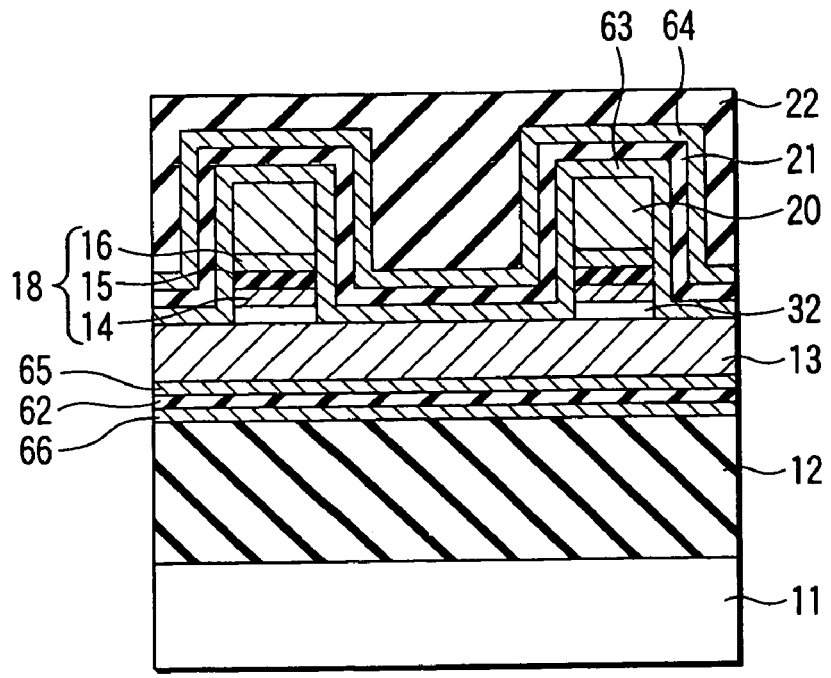
FIGS. 57A and 57B are sectional views showing a magnetic memory device having a diode as a switching element according to the twelfth embodiment of the present invention.
Figure 57B:
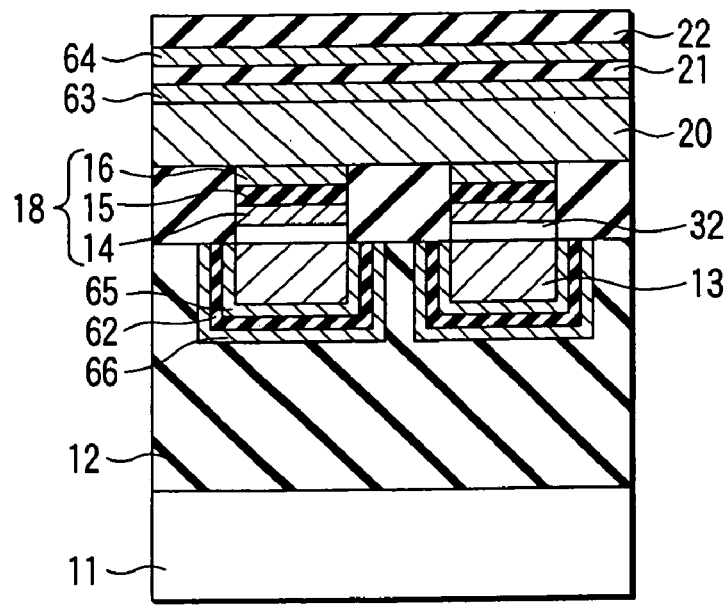

FIGS. 56A, 56B, 57A, 57B, 58A, and 58B are sectional views showing a magnetic memory device according to the twelfth embodiment of the present invention. FIGS. 56A and 56B show still another modification of the first embodiment in which no switching element is arranged. FIGS. 57A and 57B show another modification of the second embodiment in which a diode 32 is arranged as a switching element. FIGS. 58A and 58B show another modification of the third embodiment in which a transistor 44 is arranged as a switching element. The structure of the magnetic memory device according to the twelfth embodiment will be described. Note that only a structure different from that of the eleventh embodiment will be explained.

As shown in FIGS. 56A, 56B, 57A, 57B, 58A, and 58B, in the magnetic memory device according to the twelfth embodiment, a magnetic shield layer 21 formed on the upper and side surfaces of a second wiring layer 20 is sandwiched between barrier metal layers 63 and 64. A magnetic shield layer 62 formed on the bottom and side surfaces of a first wiring layer 13 is sandwiched between barrier metal layers 65 and 66.

The barrier metal layers 63 and 65 formed on the inner surfaces of the magnetic shield layers 21 and 62 are made of a material such as Co or CoFe. The barrier metal layers 64 and 66 formed on the outer surfaces of the magnetic shield layers 21 and 62 are made of a material such as Ta, TaN, or TaSiN.

When the first wiring layer 13 has a damascene structure, the magnetic shield layer 62 and barrier metal layers 65 and 66 are formed by, e.g., the following method. A first wiring groove is formed in an insulating film 12. A barrier metal layer 66, magnetic shield layer 62, and barrier metal layer 65 are sequentially formed in the groove. A first wiring material layer is formed on the magnetic shield layer 62. The barrier metal layers 65 and 66, magnetic shield layer 62, and material layer are planarized by CMP or etch-back until the surface of the first interlayer dielectric film 12 is exposed. Consequently, the magnetic shield layer 62 sandwiched between the barrier metal layers 65 and 66 is formed on the bottom and side surfaces of the first wiring layer 13.

The twelfth embodiment can obtain the same effects as those of the eleventh embodiment.

Since the barrier metal layers 63, 64, 65, and 66 are formed on the inner and outer surfaces of the magnetic shield layers 21 and 62, the twelfth embodiment attains the following effects.

The barrier metal layer 63 sandwiched between the second wiring layer 20 and the magnetic shield layer 21 can suppress reaction between the magnetic shield layer 21 and the second wiring layer 20. The barrier metal layer 63 can improve the magnetic shield performance (yoke performance) and suppress an increase in the wiring resistance of the second wiring layer 20.

The barrier metal layer 64 sandwiched between the magnetic shield layer 21 and an interlayer dielectric film 22 can improve the adhesion property between the magnetic shield layer 21 and the interlayer dielectric film 22 serving as an upper film. The barrier metal layer 64 can prevent diffusion of the shield material of the magnetic shield layer 21 to the interlayer dielectric film 22.

The barrier metal layer 65 sandwiched between the first wiring layer 13 and the magnetic shield layer 62 can suppress reaction between the magnetic shield layer 62 and the first wiring layer 13. The barrier metal layer 65 can improve the yoke performance and suppress an increase in the wiring resistance of the first wiring layer 13.

The barrier metal layer 66 sandwiched between the magnetic shield layer 62 and the interlayer dielectric film 12 can improve the adhesion property between the magnetic shield layer 62 and the interlayer dielectric film 12 serving as a lower film. The barrier metal layer 66 can prevent diffusion of the shield material of the magnetic shield layer 62 to the interlayer dielectric film 12.

THIRTEENTH EMBODIMENT

The thirteenth embodiment is a modification of a magnetic memory device without any switching element.

Figure 59:
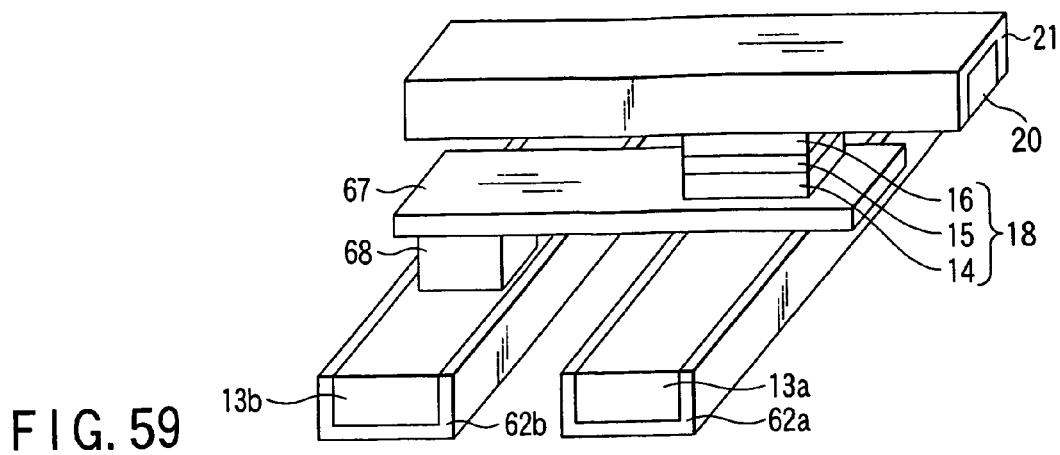
FIGS. 59 and 60 are perspective views showing a magnetic memory device according to a thirteenth embodiment of the present invention.
Figure 60:
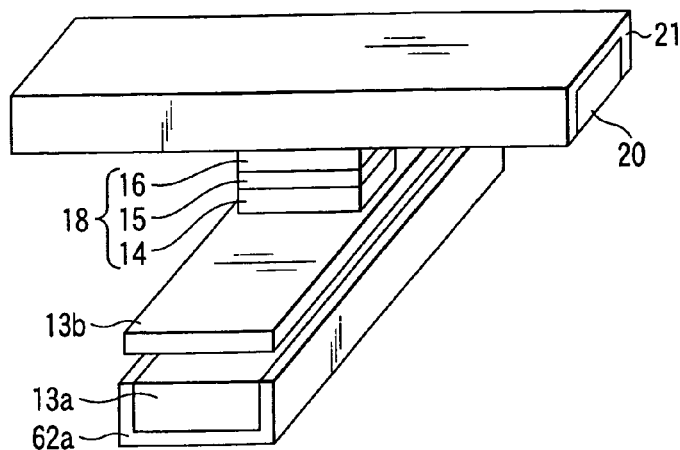
Figure 61:
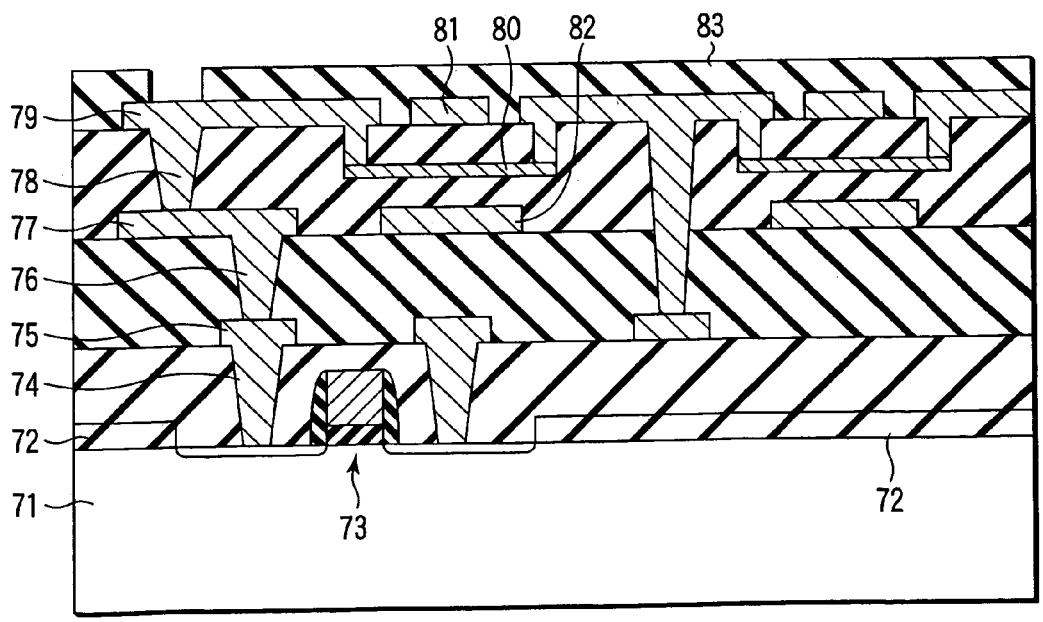
FIG. 61 is a sectional view showing a conventional magnetic memory device.

FIGS. 59 and 60 are perspective views showing the magnetic memory device according to the thirteenth embodiment of the present invention. The structure of the magnetic memory device according to the thirteenth embodiment will be described. Note that a structure different from that in FIGS. 53A and 53B will be mainly explained.

In the structure shown in FIG. 59, a first wiring layer 13 is divided into a write word line 13a and read word line 13b. The write word line 13a runs, e.g., perpendicularly to a second wiring layer (bit line) 20, and is spaced apart from an MTJ element 18. The read word line 13b runs parallel to the write word line 13a on the same plane, and is connected to the MTJ element 18 via a lower metal layer 67 and contact 68. Magnetic shield layers 62a and 62b are formed on the side and bottom surfaces of the write and read word lines 13a and 13b.

Also in the structure shown in FIG. 60, the first wiring layer 13 is divided into the write word line 13a and read word line 13b. The write word line 13a runs, e.g., perpendicularly to the second wiring layer (bit line) 20, and is spaced apart from the MTJ element 18. The magnetic shield layer 62a is formed on the side and bottom surfaces of the write word line 13a. The read word line 13b runs parallel to the write word line 13a, and is arranged in contact with the MTJ element 18 between the MTJ element 18 and the write word line 13a.

The thirteenth embodiment can obtain the same effects as those of the eleventh embodiment.

In the thirteenth embodiment, the first wiring layer 13 is divided into the write word line 13a and read word line 13b. Compared with a simple cross point structure as shown in FIGS. 53A and 53B, a read signal can be set large to increase the read speed.

Since the write and read lines are partially separated, no voltage bias is applied to the tunnel junction layer 15 in write to improve the reliability.

In the thirteenth embodiment, the absence of any switching element can decrease the cell size and facilitate development of a multilayered structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device manufacturing method, comprising:
    forming a first wiring layer which runs in a first direction;
    selectively forming a memory element above the first wiring layer;
    forming a first insulating layer around the memory element;
    forming, on the first insulating layer and the memory element, second wiring layers which run in a second direction different from the first direction;
    removing a portion of the first insulating layer not covered with the second wiring layers by using the second wiring layers as a mask; and
    forming a first magnetic shield layer over the second wiring layers to cover the first and second wiring layers and the memory element.

2. The method according to claim 1, wherein the first magnetic shield layer is formed with a film thickness not more than ½ a distance between the second wiring layers.

3. The method according to claim 1, wherein the memory element includes an MTJ element formed from at least a first magnetic layer, a second magnetic layer, and a nonmagnetic layer.

4. The method according to claim 1, further comprising forming a diode between the first wiring layer and the memory element or between the each second wiring layer and the memory element.

5. The method according to claim 1, further comprising forming a transistor to be connected to the memory element.

6. The method according to claim 1, further comprising, after forming the first magnetic shield layer, removing the first magnetic shield layer from an upper surface of said each second wiring layer and from between the second wiring layers to leave the first magnetic shield layer on a side surface of said each second wiring layer and a side surface of the memory element.

7. The method according to claim 6, wherein the first magnetic shield layer is removed by anisotropic etching.

8. The method according to claim 1, further comprising:
    before forming the first magnetic shield layer, forming a second magnetic shield layer on an upper surface of said each second wiring layer; and
    after forming the first magnetic shield layer, removing a selected portion of the first magnetic shield layer to leave the first magnetic shield layer on a side surface of said each second wiring layer and a side surface of the memory element.

9. The method according to claim 1, further comprising, before forming the first magnetic shield layer:
    forming a second magnetic shield layer on an upper surface of said each second wiring layer; and
    forming a second insulating layer on a side surface of said each second wiring layer and a side surface of the memory element.

10. The method according to claim 9, further comprising, after forming the first magnetic shield layer, removing the first magnetic shield layer from an upper surface of the second magnetic shield layer and from between the second wiring layers to leave the first magnetic shield layer on a side surface of the second insulating layer.

11. The method according to claim 1, wherein
    the second wiring layers are formed with a width of said each second wiring layer set larger than a width of the memory element in the first direction,
    a portion of the first insulating layer not covered with the second wiring layers is removed using the second wiring layers as a mask to leave the first insulating layer on a side surface of the memory element that is recessed from a side surface of said each second wiring layer, and
    the first magnetic shield layer is formed on the side surface and an upper surface of said each second wiring layer and a side surface of the first insulating layer.

12. The method according to claim 11, further comprising, after forming the first magnetic shield layer, removing the first magnetic shield layer from an upper surface of a second magnetic shield layer and from between the second wiring layers to leave the first magnetic shield layer on the side surface of the first insulating layer and the side surface of said each second wiring layer.

13. The method according to claim 12, further comprising, before forming the first magnetic shield layer, forming the second magnetic shield layer on the upper surface of said each second wiring layer.

14. A magnetic memory device manufacturing method, comprising:

forming a first wiring layer which runs in a first direction;

forming above the first wiring layer a straight memory element which runs in the first direction;

forming a first insulating layer around the memory element;

forming, on the first insulating layer and the memory element, second wiring layers which run in a second direction different from the first direction;

removing portions of the first insulating layer and the memory element which are not covered with the second wiring layers by using the second wiring layers as a mask to form the memory element into an island shape; and forming a first magnetic shield layer over the second wiring layers.

* * * * *